(12) United States Patent
Lee et al.

(10) Patent No.: US 12,166,490 B2
(45) Date of Patent: Dec. 10, 2024

(54) CONTROLLING DUTY CYCLE DISTORTION WITH DIGITAL CIRCUIT

(71) Applicant: PARADE TECHNOLOGIES, LTD., San Jose, CA (US)

(72) Inventors: YingFan Lee, Taipei (TW); Zhih-Ling Lu, Taipai (TW); Andrew Lee, Taipei (TW); Xin Jin, San Jose, CA (US)

(73) Assignee: PARADE TECHNOLOGIES, LTD., San Jose, CA (US)

( * ) Notice: Subject to any disclaimer, the term of this patent is extended or adjusted under 35 U.S.C. 154(b) by 125 days.

(21) Appl. No.: 18/149,009

(22) Filed: Dec. 30, 2022

(65) Prior Publication Data
US 2024/0223171 A1 Jul. 4, 2024

(51) Int. Cl.
*H03K 5/156* (2006.01)

(52) U.S. Cl.
CPC ................................ *H03K 5/1565* (2013.01)

(58) Field of Classification Search
None
See application file for complete search history.

(56) References Cited

U.S. PATENT DOCUMENTS

| | | | |
|---|---|---|---|
| 6,426,660 B1 | 7/2002 | Ho et al. | |
| 6,577,202 B1 | 6/2003 | Atallah et al. | |
| 6,593,789 B2 | 7/2003 | Atallah et al. | |
| 7,015,739 B2 | 3/2006 | Lee et al. | |
| 7,058,120 B1 | 6/2006 | Lu et al. | |
| 7,199,634 B2 | 4/2007 | Cho et al. | |
| 7,501,870 B2 | 3/2009 | Choi et al. | |
| 8,106,695 B2 | 1/2012 | Miyano | |
| 8,154,331 B2 | 4/2012 | Kim et al. | |
| 8,280,331 B2 | 10/2012 | Nagaraj et al. | |
| 8,362,818 B2 | 1/2013 | Suzuki | |
| 8,380,138 B2 | 2/2013 | Wadhawa et al. | |
| 8,669,799 B1 | 3/2014 | King | |
| 8,773,186 B1 | 7/2014 | Liou et al. | |
| 9,071,237 B2 | 6/2015 | Lee et al. | |
| 10,418,978 B1 | 9/2019 | Au Yeung et al. | |
| 12,003,241 B1 * | 6/2024 | Lee .......................... H03K 5/01 |
| 2012/0007647 A1 | 1/2012 | Shim et al. | |

OTHER PUBLICATIONS

Lee et al., Non-Final Office Action, U.S. Appl. No. 18/149,016, Sep. 14, 2023, 12 pgs.
Lee et al., Notice of Allowance, U.S. Appl. No. 18/149,016, Jan. 31, 2024, 5 pgs.

* cited by examiner

*Primary Examiner* — Cassandra F Cox
(74) *Attorney, Agent, or Firm* — Morgan, Lewis & Bockius LLP

(57) ABSTRACT

A method controls duty cycle distortion of clock signals. An electronic device obtains an input clock signal having a first frequency and a sampling clock signal having a second frequency that is lower than the first frequency. The sampling clock signal has a random noise distribution. The sampling clock signal is applied to sample high voltage duty cycles and low voltage duty cycles of the input clock signal for a duration of time to obtain a sampling result. The electronic device determines a duty cycle distortion level of the input clock signal in the duration of time based on the sampling result. A duty cycle control signal is generated based on the duty cycle distortion level to control the high voltage duty cycles of the input clock signal.

20 Claims, 15 Drawing Sheets

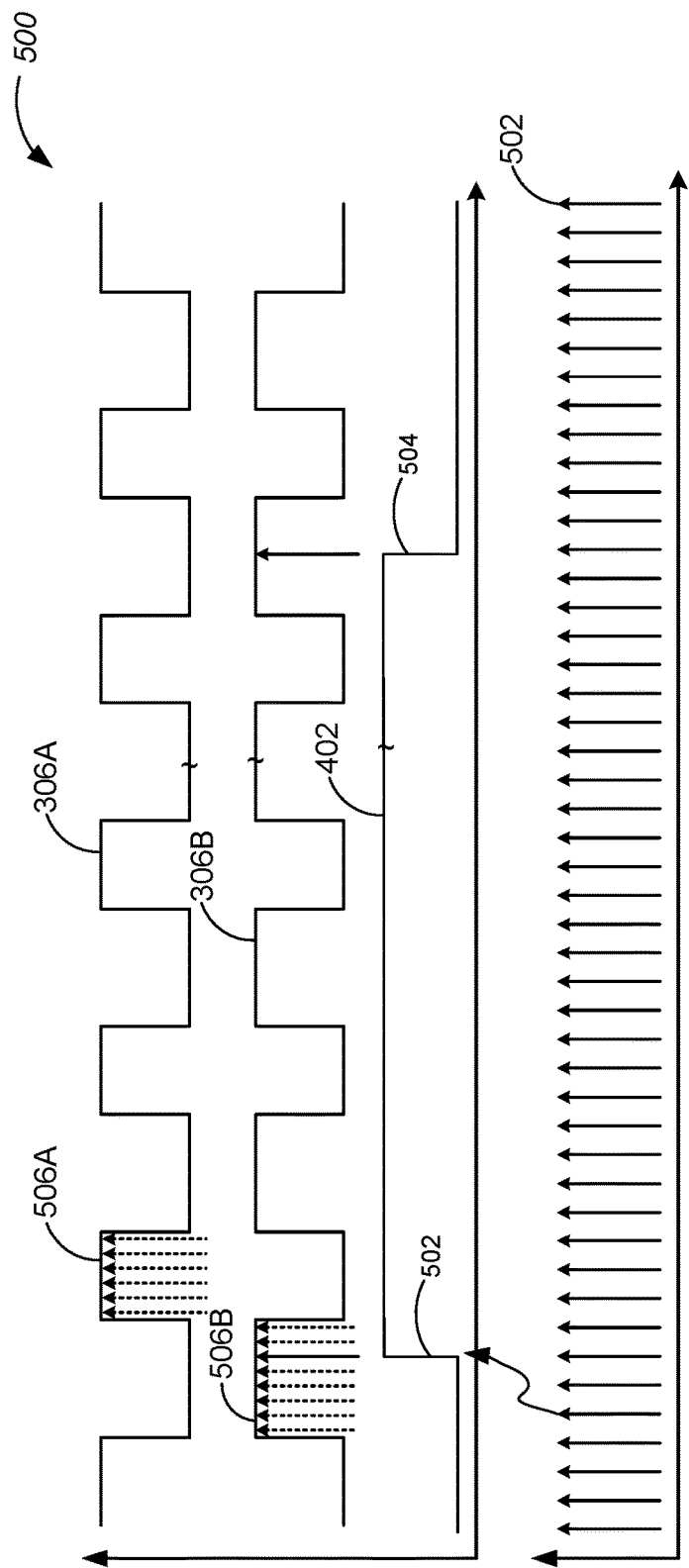
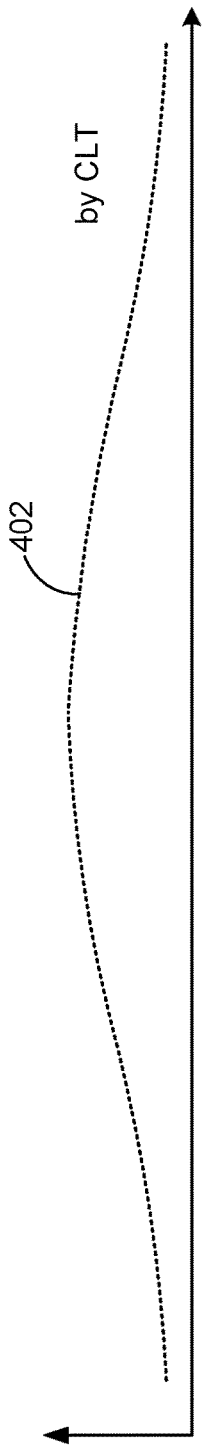
Figure 5A
Figure 5B

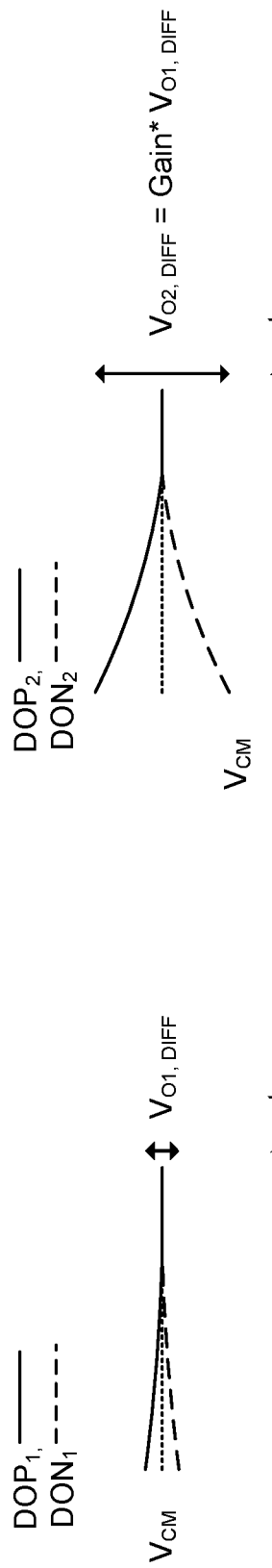
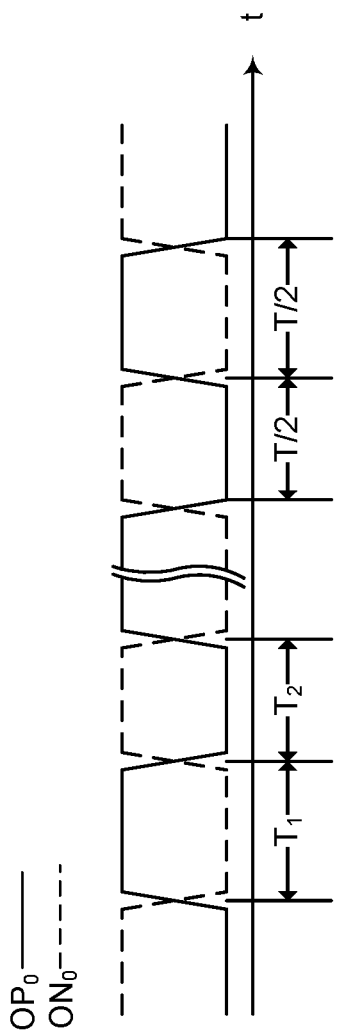
Figure 8A
Figure 8B
Figure 8C

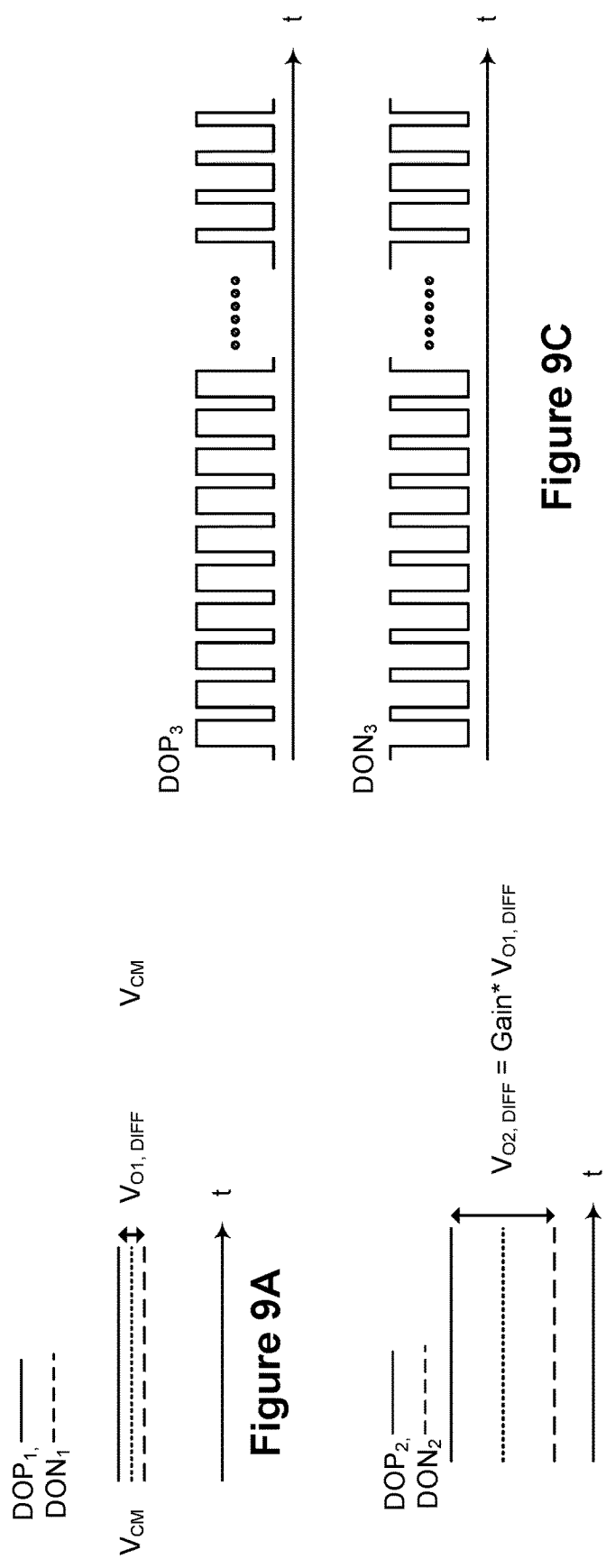

CONTROLLING DUTY CYCLE DISTORTION WITH DIGITAL CIRCUIT

RELATED APPLICATIONS

This application is related to U.S. patent application Ser. No. 18/149,016, titled "Controlling Duty Cycle Distortion with Mixed-Signal Circuit", filed Dec. 30, 2022, which is incorporated by reference in its entirety.

TECHNICAL FIELD

The disclosed embodiments relate generally to data transmission technology, including but not limited to methods, systems, and devices for controlling the duty cycle distortion of a clock signal that controls data transmission for a data channel under a data communication protocol (e.g., USB4 or DisplayPort).

BACKGROUND

Many electronic devices are physically coupled to each other and communicate with each other using data links and interfaces that comply with high-speed data communication protocols. These data communication protocols rely on high fidelity clock signals to control synchronization of data transmitted over the data links and interfaces. A full rate data transmission system utilizes a clock signal having a full frequency to enable data transmission at a full data rate, and only a single data bit is transmitted in each clock cycle. In contrast, a half rate data transmission system utilizes a clock signal having half of the full frequency to enable data transmission at the full data rate, and two data bits are transmitted in each clock cycle. The half rate data transmission system reduces power consumption but is more susceptible to duty cycle distortion. It would be beneficial to have an efficient mechanism to control duty cycle distortion of a clock signal.

SUMMARY

This application is directed to electronic systems, electronic devices, data links, data ports, and data interfaces that control duty cycle distortion (also called even odd jitter) of a clock signal within a duty cycle distortion limit for data communicated under a data communication protocol. For example, the duty cycle distortion limit is 3% of a unit interval (UI) time of a clock signal for USB4 v1.0, 2% of the UI time of the clock signal for USB4 v2.0 Gen 4 PAM-3, and 1% of the UI time of the clock signal for USB4. A half rate data transmission system is established to use both high and low duty cycles or both rising and falling edges of a clock signal to enable data transmission at a data rate that is twice the frequency of the clock signal. Two data bits are transmitted within each clock cycle of the clock signal. Compared with a full rate data transmission system having a data rate matching the frequency of the clock signal, the half rate data transmission system consumes less power and is controlled to satisfy the duty cycle distortion limit. In an example associated with USB4 v2.0, the data rate is approximately 40 Gbps PAM-3 for a data lane. The unit interval of time is about 39.1 picoseconds (ps), and the limit required for the duty cycle distortion is less than 0.39 ps.

In some embodiments, high voltage duty cycles and low voltage duty cycles of an input clock signal are sampled digitally using a random noise low frequency clock signal. A sampling result is used to generate a digital control signal to control high voltage duty cycles and/or low voltage duty cycles of the input clock signal. Alternatively, in some embodiments, lengths of high voltage duty cycles and low voltage duty cycles of the input clock signal are converted to two distinct direct current (DC) voltage levels. A sampling result or a difference of the two distinct DC voltage levels is used to generate a digital duty cycle control signal to control the high voltage duty cycle, the low voltage duty cycle, or both. In some embodiments, the digital duty cycle control signal is applied to control the high voltage duty cycle, the low voltage duty cycle, or both for an inverse clock signal that is complementary to the input clock signal.

In one aspect, a method is implemented by an electronic device for controlling duty cycle distortion of clock signals. The method includes obtaining an input clock signal having a first frequency and obtaining a sampling clock signal having (i) a random noise distribution and (ii) a second frequency that is lower than the first frequency. The method further includes applying the sampling clock signal to sample high voltage duty cycles and low voltage duty cycles of the input clock signal for a duration of time to obtain a sampling result. The duration of time is longer than a threshold duration (e.g., 100 milliseconds). The method further includes determining a duty cycle distortion level of the input clock signal in the duration of time based on the sampling result. The method further includes, based on the duty cycle distortion level, generating a duty cycle control signal to control the high voltage duty cycles of the input clock signal (e.g., to reduce the duty cycle distortion level of the input clock signal below a duty cycle distortion limit).

In some embodiments, the method further includes generating a first periodic signal that is enabled in each high voltage duty cycle and generating a second periodic signal that is enabled in each low voltage duty cycle of the input clock signal. Applying the sampling clock signal further includes sampling the first periodic signal and the second periodic signal with the sampling clock signal in the duration of time. Further, in some embodiments, sampling the first periodic signal with the sampling clock signal includes combining the first periodic signal and the sampling clock signal by a first XOR logic and a first latch to generate first samples that indicate whether each rising edge of the sampling clock signal is synchronous with the high voltage duty cycles of the input clock signal in the duration of time. Sampling the first periodic signal with the sampling clock signal further includes accumulating the first samples to determine a first count of rising edges of the sampling clock signal that are synchronous with the high voltage duty cycles of the input clock signal in the duration of time.

In some embodiments, the random noise distribution of the sampling clock signal includes a Gaussian distribution centered at the second frequency.

In some embodiments, the second frequency of the sampling clock signal is at least two orders of magnitude greater than the first frequency of the input clock signal.

In another aspect, an electronic device includes sampler circuit, a signal processor, and a duty cycle modulator. The sampler circuit is configured to obtain a sampling clock signal and apply the sampling clock signal to sample high voltage duty cycles and low voltage duty cycles of an input clock signal for a duration of time. The input clock signal has a first frequency, and the sampling clock signal has (i) a random noise distribution and (ii) a second frequency that is lower than the first frequency. The signal processor is coupled to the sampler circuit and configured to operate in accordance with sampling of the high voltage duty cycles and the low voltage duty cycles of the input clock signal, thereby determining a duty cycle distortion level of the input clock signal in the duration of time and generating a duty cycle control signal from the duty cycle distortion level. The duty cycle modulator is coupled to the signal processor and configured to control the high voltage duty cycles of the input clock signal based on the duty cycle control signal (e.g., to reduce the duty cycle distortion level of the input clock signal below a duty cycle distortion limit).

In yet another aspect, a method is implemented to control duty cycle distortion of clock signals. The method includes obtaining an input clock signal and generating a first output voltage and a second output voltage from the input clock signal. The first output voltage has a first direct current (DC) voltage level indicating, in real time, a first duty cycle length of high voltage duty cycles of the input clock signal. The second output voltage has a second DC voltage level indicating, in real time, a second duty cycle length of low voltage duty cycles of the input clock signal. The difference between the first DC voltage level and the second DC voltage level corresponds to the duty cycle distortion level of the input clock signal. The method further includes, based on the difference between the first DC voltage level and the second DC voltage level, generating a duty cycle control signal to control the high voltage duty cycles of the input clock signal.

In some embodiments, the method further includes generating a first periodic signal that is enabled in each high voltage duty cycle, generating a second periodic signal that is enabled in each low voltage duty cycle of the input clock signal, applying a first low-pass filter to filter the first periodic signal and generate the first output voltage, and applying a second low-pass filter to filter the second periodic signal and generate the second output voltage. Further, in some embodiments, the method further includes amplifying the first filtered voltage and second filtered signal by a gain to generate a first amplified voltage and a second amplified voltage. Additionally, in some embodiments, the method further includes dynamically adjusting the gain to control the first amplified voltage and the second amplified signal in a predefined output dynamic range.

In some embodiments, the method further includes converting the difference between the first DC voltage level and the second DC voltage level to the duty cycle control signal using at least an analog-to-digital converter (ADC).

In another aspect, an electronic device includes a low pass filter unit and a processor. The low pass filter unit is configured to generate a first output voltage and a second output voltage based on an input clock signal. The first output voltage has a first DC voltage level indicating a first cycle length of high voltage duty cycles of the input clock signal in real time. The second output voltage has a second DC voltage level indicating a second cycle length of low voltage duty cycles of the input clock signal in real time. The difference between the first and second DC voltage levels corresponds to the duty cycle distortion level of the input clock signal. The processor is coupled to the low pass filter unit and configured to generate a duty cycle control signal to control the high voltage duty cycles of the input clock signal based on the first and second output voltages.

These illustrative embodiments are mentioned not to limit or define the disclosure, but to provide examples to aid understanding thereof. Additional embodiments are discussed in the Detailed Description, and further description is provided there.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

FIG. 5A is a temporal diagram showing two periodic signals, a sampling clock signal, and rising edges of the sampling clock signal, in accordance with some embodiments. FIG. 5B is a frequency diagram of an example sampling clock signal, in accordance with some embodiments.

FIGS. 8A-8C are temporal diagrams of differential signals in an MSP module of a duty cycle controlling system shown in FIG. 6, in accordance with some embodiments.

FIGS. 9A-9E are temporal diagrams of differential signals in an MSP module of a duty cycle controlling system shown in FIG. 7, in accordance with some embodiments.

Like reference numerals refer to corresponding parts throughout the several views of the drawings.

DESCRIPTION OF EMBODIMENTS

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
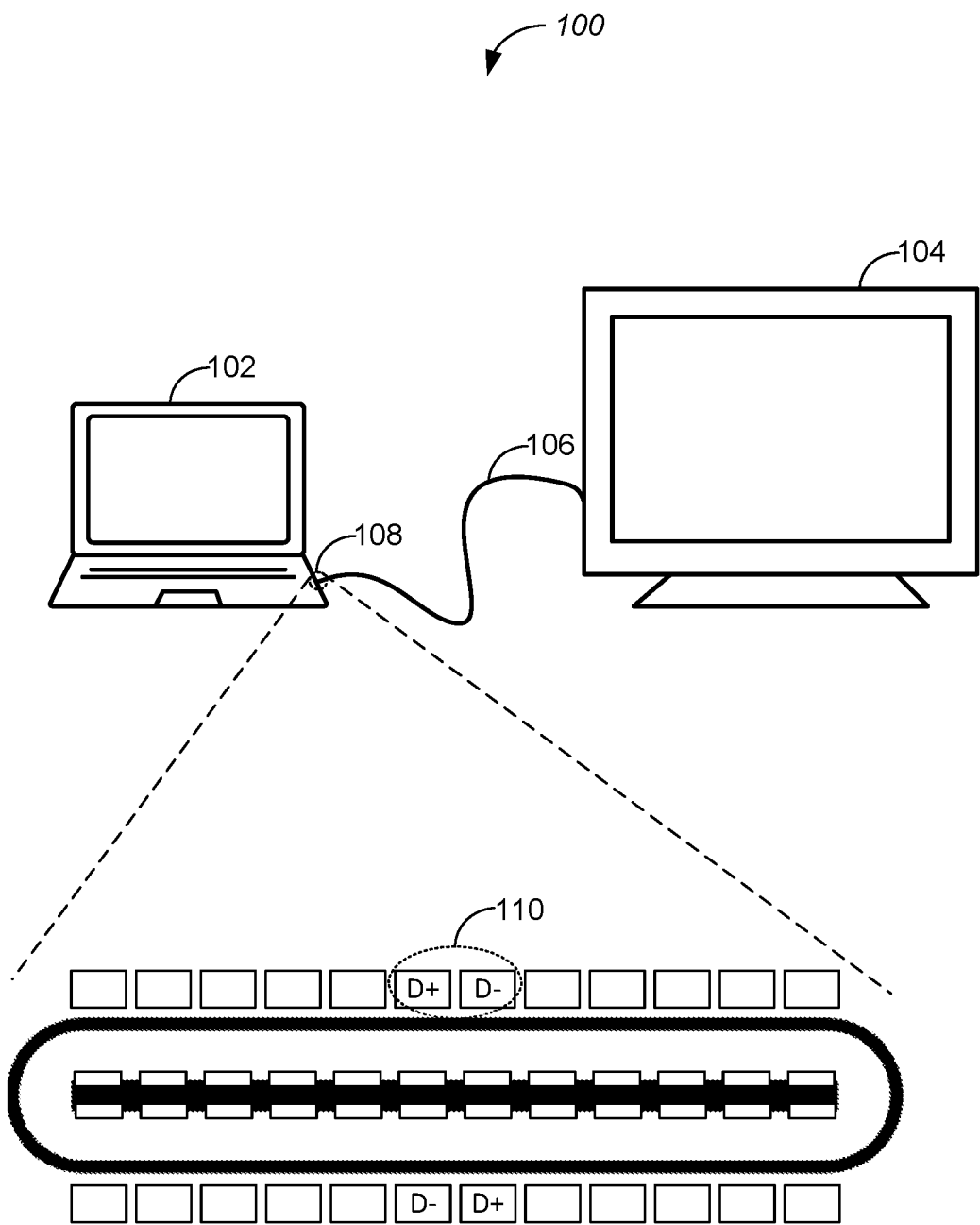
FIG. 1 is a block diagram of an example electronic system in which electronic devices are electrically via a data link, in accordance with some embodiments.

FIG. 1 is a block diagram of an example electronic system 100 in which a first electronic device 102 is electrically coupled to a second electronic device 104 via a data link 106, in accordance with some embodiments. The first electronic device 102 and second electronic device 104 are configured to exchange data via the data link 106. In an example, the first electronic device 102 includes a video source, and the second electronic device 104 includes a display device. The display device has a screen configured to display visual content provided by the first electronic device 102 via the data link 106. In another example not shown, the first electronic device 102 includes a desktop computer, and the second electronic device 104 includes a mobile phone that exchanges data with the desktop computer 102 via the data link 106. Examples of the electronic devices 102 and 104 include, but are not limited to, a desktop computer, a laptop computer, a tablet computer, a video player, a camera device, a gameplayer device, or other formats of electronic devices which are configured to provide data or receive data. Video data, audio data, text, program data, control data, configuration data, or any other data are transmitted between the first and second electronic devices 102 and 104 via the data link 106.

The data link 106 includes two connectors 108 at two of its ends. The two connectors 108 are configured to connect the data link 106 to respective connectors 108 of the first electronic device 102 and second electronic device 104. For example, the connector 108 is a DisplayPort connector having a digital display interface developed by a consortium of personal computer and chip manufacturers and standardized by the Video Electronics Standards Association (VESA). The DisplayPort connector is configured to connect the data link 106 to the first electronic device 102 and carry video, audio, and control data according to a data communication protocol. In another example, the connector 108 is a universal serial bus (USB) connector, e.g., configured to connect a computer to a peripheral device. Exemplary types of the USB connector include, but are not limited to, USB-A, USB-B, USB-C, USB Micro-A, USB Micro-B, USB Mini-B, USB 3.0A, USB 3.0B, USB 3.0 Micro B, and USB Micro-AB. Further, a data communication protocol of USB4 is applied to communicate data using a USB-C connector, thereby providing a throughput of up to 40 Gbps, power delivery of up to 100 W, support for 4K and 5K displays, and backward compatibility with USB 3.2 and USB 2.

In some embodiments, the connector 108 includes a bidirectional channel for communicating a stream of data between the first and second electronic device 102 and 104. The bidirectional channel of the connector 108 includes two data lanes and a pair of differential pins 110 coupled to the two data lanes. The pair of differential pins 110 are configured to receive a differential input signal from the first electronic device 102 or the second electronic device 104, and the differential input signal carries a serial data command or serial content data (e.g., video or audio data) that are communicated via the two data lanes of the connector 108. As such, the two data lanes and pair of differential pins 110 of the connector 108 are configured to facilitate bidirectional communication between the first electronic device 102 and the second electronic device 104. The bidirectional channel is a data channel or an auxiliary channel. Specifically, the auxiliary channel of the connector 108 is used for communication of additional serial data beyond video and audio data, such as consumer electronics control (CEC) commands. In some embodiments, the pair of differential pins 110 is coupled to a dedicated set of twisted-pair wires configured to carry two input signals of the differential input signal.

Each connector 108 of the data link 106 is configured to be coupled to a respective connector 108 of the first electronic device 102 and a respective connector 108 of the second electronic device 104. Each connector 108 of the data link 106 is bidirectional, so is each respective connector 108 of the electronic devices 102 and 104. When the connector 108 of the data link 106 is coupled to the first or second electronic device 102 or 104, the pair of differential pins 110 of the connector 108 of the data link 106 are physically and electrically coupled to a pair of differential pins 110 of the connector 108 of the first or second electronic device 102 or 104. The pair of differential pins 110 of the connector 108 of the first or second electronic device 102 or 104 is configured to receive data from, or transmit data to, the differential pins 110 of the connector 108 of the data link 106.

A data transmission system is applied in the electronic system 100 to communicate data between the first and second electronic devices 102 and 104 and via the data link 106. In some embodiments, the data transmission system utilizes both high duty cycles and low duty cycles of a clock signal having a clock frequency and enables data transmission at a full data rate that doubles the clock frequency. The high duty cycles correspond to a high voltage level of the clock signal in each clock cycle, and the low duty cycles correspond to a low voltage level of the clock signal in each clock cycle. In some embodiments, the data transmission system utilizes both rising edges and falling edges of the clock signal to enable data transmission at the full data rate. Such a data transmission system transmits two data bits in each clock cycle, and conserves power consumption compared with a system using a faster clock signal to transmit a single data bit in each clock cycle.

The data transmission system controls duty cycle distortion of the clock signal below a duty cycle distortion limit by analog signal circuit or by mixed signal circuit. For example, a sampling clock signal has a sampling frequency lower than the clock frequency and is applied to sample high voltage duty cycles and low voltage duty cycles of the clock signal. In another example, two output voltages are generated based on duty cycle lengths of high voltage duty cycles and low voltage duty cycles of the input clock signal. A sampling result or a difference of the two output voltages is used to determine a duty cycle distortion level of the clock signal. Based on the duty cycle distortion level, a duty cycle control signal is generated to control the high voltage duty cycles of the clock signal below the duty cycle distortion limit.

Figure 2:
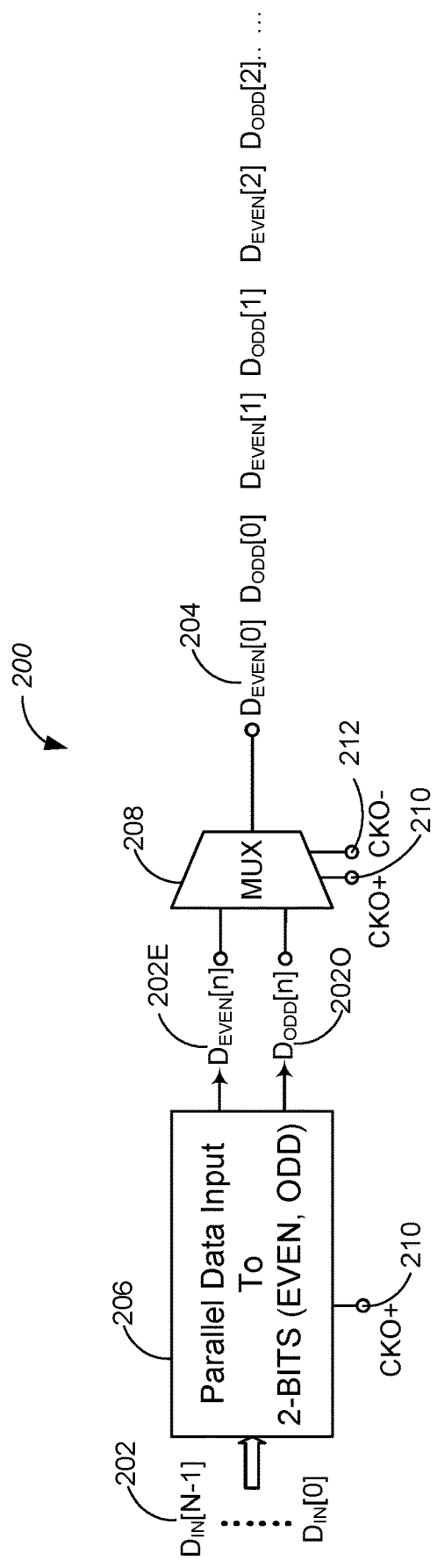
FIG. 2 is a block diagram of an example data multiplexing path of a data transmission system, in accordance with some embodiments.

FIG. 2 is a block diagram of an example data multiplexing path 200 of a data transmission system, in accordance with some embodiments. The data multiplexing path 200 is configured to receive a plurality of parallel data 202 and serialize the plurality of parallel data to output a single serial data signal 204. The plurality of parallel data 202 are arranged into a temporal sequence of serial data that is sequentially outputted via the single serial data signal 204. The data multiplexing path 200 includes a data serializer 206 and a multiplexer 208. The data serializer 206 receives the plurality of parallel data 202 and converts the plurality of parallel data 202 into an even serial data signal 202E and an odd serial data signal 202O. The even serial data signal 202E temporally serializes a subset of even data $D_{EVEN}[n]$ of the plurality of parallel data 202, and the odd serial data signal 202O temporally serializes a subset of odd data $D_{ODD}[n]$ of the plurality of parallel data 202, where n is a positive integer. The multiplexer 208 interleaves the subset of even data $D_{EVEN}[n]$ and the subset of odd data $D_{ODD}[n]$ and serializes the subset of even data $D_{EVEN}[n]$ and the subset of odd data $D_{ODD}[n]$ onto the single serial data signal 204.

In some embodiments, the data serializer 206 includes two parallel-in serial-out (PISO) shifter registers to shift the subset of even data $D_{EVEN}[n]$ and the subset of odd data $D_{ODD}[n]$ of the plurality of parallel data 202 to the even serial data signal 202E and the odd serial data signal 202O based on an input clock signal 210, respectively. The PISO shifter registers operate based on edges of the input clock signal 210. Further, in some embodiments, the subset of even data $D_{EVEN}[n]$ and the subset of odd data $D_{ODD}[n]$ are serialized based on rising edges of the input clock signal 210. Alternatively, in some embodiments, the subset of even data $D_{EVEN}[n]$ and the subset of odd data $D_{ODD}[n]$ are serialized based on falling edges of the input clock signal 210. Each data bit of the subset of even data $D_{EVEN}[n]$ and the subset of odd data $D_{ODD}[n]$ corresponds to a respective clock cycle of the input clock signal 210.

In some embodiments, the input clock signal 210 corresponds to an inverse clock signal 212 that is complementary to the input clock signal 210. The multiplexer 208 receives both the input clock signal 210 and the inverse clock signal 212, and combines the even serial data signal 202E and the odd serial data signal 202O under the control of the input clock signal 210 and the inverse clock signal 212. Further, in some embodiments, the multiplexer 208 uses high duty cycles of the input clock signal 210 and the inverse clock signal 212 to select the even serial data signal 202E and the odd serial data signal 202O to be outputted to the single serial data signal 204 in an alternating matter. The high duty cycles of the input clock signal 210 and the inverse clock signal 212 correspond to the high duty cycles and low duty cycles of the input clock signal 210, respectively. Alternatively, in some embodiments, the multiplexer 208 uses rising edges of the input clock signal 210 and the inverse clock signal 212 to select the even serial data signal 202E and the odd serial data signal 202O to be outputted to, and held, at the single serial data signal 204 in an alternating matter. The rising edges of the input clock signal 210 and the inverse clock signal 212 correspond to the rising edges and falling edges of the input clock signal 210, respectively. Alternatively, in some embodiments, the multiplexer 208 uses falling edges of the clock signals 210 and 212 to select the serial data signals 202E and 202O to be outputted to, and held, at the single serial data signal 204 in an alternating matter. By these means, two data bits are transmitted by the data multiplexing path 200 during each clock cycle of the input clock signal 210, allowing the plurality of parallel data 202 to be transmitted at a data rate that doubles a clock frequency of the input clock signal 210.

Figure 3:
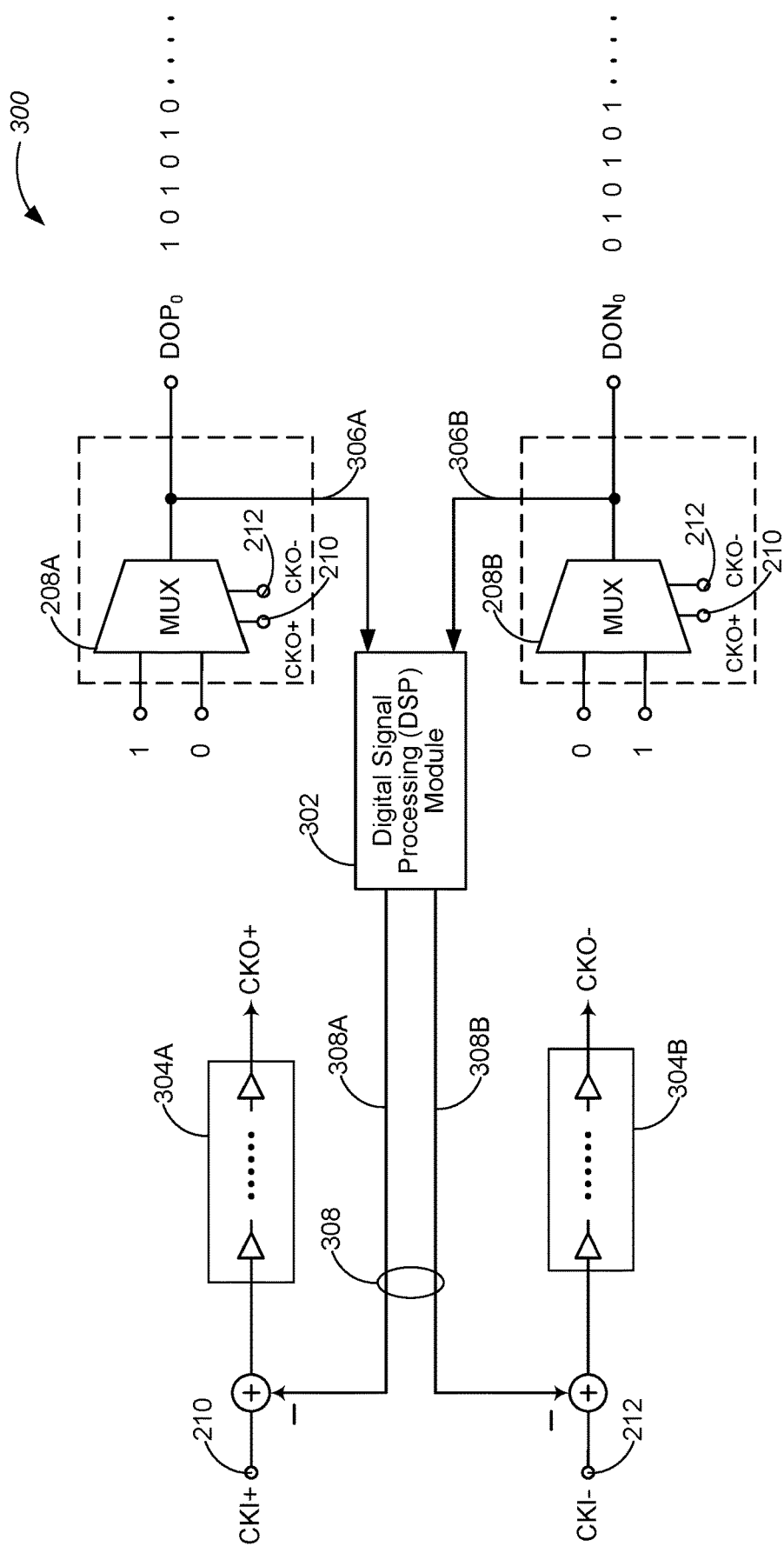
FIG. 3 is a block diagram of an example duty cycle controlling system including a digital signal processing (DSP) module, in accordance with some embodiments.

FIG. 3 is a block diagram of an example duty cycle controlling system 300 including a digital signal processing (DSP) module 302, in accordance with some embodiments. The duty cycle controlling system 300 obtains an input clock signal 210 having a first frequency and generates a duty cycle control signal 308 to control distortion (also called even odd jitter) of duty cycles of the input clock signal 210 below a duty cycle distortion limit. The duty cycle controlling system 300 includes a first multiplexer 208A, a second multiplexer 208B, the DSP module 302, and two duty cycle modulators 304A and 304B. The first and second multiplexers 208A and 208B replicate multiplexers of a data multiplexing path 200 (FIG. 2), and are configured to generate a first periodic signal 306A that is enabled in each high voltage duty cycle of the input clock signal 210 and a second periodic signal 306B that is enabled in each low voltage duty cycle of the input clock signal 210 (i.e., in each high voltage duty cycle of the inverse clock signal 212). The DSP module 302 converts a pair of differential periodic signals 306 including the first and second periodic signals 306A and 306B to a duty cycle control signal 308. The duty cycle control signal 308 controls the high voltage duty cycles of the input clock signal 210 and the high voltage duty cycles of the inverse clock signal 212. In some embodiments, the duty cycle control signal 308 includes a first duty cycle control signal 308A and a second duty cycle control signal 308B for controlling the duty cycles of the input clock signal 210 and the inverse clock signal 212, respectively.

In some embodiments, in accordance with a determination that the high voltage duty cycle of the input clock signal 210 is greater than the low voltage duty cycle of the input clock signal 210 (e.g., by the duty cycle distortion limit), the duty cycle control signal 308 (e.g., the first duty cycle control signal 308A) controls the duty cycle modulator 304A to reduce the high voltage duty cycle of the input clock signal 210, and the duty cycle control signal 308 (e.g., the second duty cycle control signal 308B) controls the duty cycle modulator 304B to increase the high voltage duty cycle of the inverse clock signal 212. In some embodiments, in accordance with a determination that the high voltage duty cycle of the input clock signal 210 is less than the low voltage duty cycle of the input clock signal 210 (e.g., by the duty cycle distortion limit), the duty cycle control signal 308 controls the duty cycle modulator 304A to increase the high voltage duty cycle of the input clock signal 210, and the duty cycle control signal 308 controls the duty cycle modulator 304B to decrease the high voltage duty cycle of the inverse clock signal 212.

In some embodiments, the duty cycle modulator 304A applies a delay time to the input clock signal 210 (CLK) to generate a delayed input clock signal CLKD based on the duty cycle control signal 308. The input clock signal 210 (CLK) is combined with the delayed input clock signal CLK_via first logic circuit to increase or reduce the high voltage duty cycle of the input clock signal 210 based on the delay time. Conversely, the duty cycle modulator 304B applies a delay time to the inverse clock signal 212 (CLK_) to generate a delayed inverse clock signal CLKD_based on the second duty cycle control signal 308B. The inverse clock signal 212 (CLK_) is combined with the delayed inverse clock signal (CLKD_) via second logic circuit to increase or reduce the high voltage duty cycle of the inverse clock signal 210 based on the delay time. More details on conversion of a delay to a duty cycle are explained below with reference to FIG. 10D.

In some embodiments, the duty cycle control signal 308 includes a multi-bit digital control signal having a subset of most significant bits (MSBs) and a subset of least significant bits (LSBs). The multi-bit digital control signal controls the duty cycle of the input clock signal 210 by selecting a first delay time of a first plurality of delay times for the input clock signal 210 by the multi-bit digital control signal. Further, in some embodiments, the multi-bit digital control signal controls the duty cycle of the inverse clock signal 212 by selecting a second delay time of a second plurality of delay times for the inverse clock signal 212 by the second multi-bit digital control signal. The first delay time is equal to the second delay time, such that the input clock signal 210 and the inverse clock signal 212 remain complementary to each other after correction of duty cycle distortion.

The DSP module 302 includes only digital signal circuit configured to convert the first and second periodic signals 306A and 306B to the duty cycle control signal 308. By these means, the duty cycle controlling system 300 provides a digital solution to control the duty cycle distortion level of the input clock signal 210 and the inverse clock signal 212 below the duty cycle distortion limit (e.g., 3% of a UI time of the input clock signal 210 for USB v1.0, 2% for USB v2.0 Gen 4 PAM-3, 1% for USB4).

Figure 4:
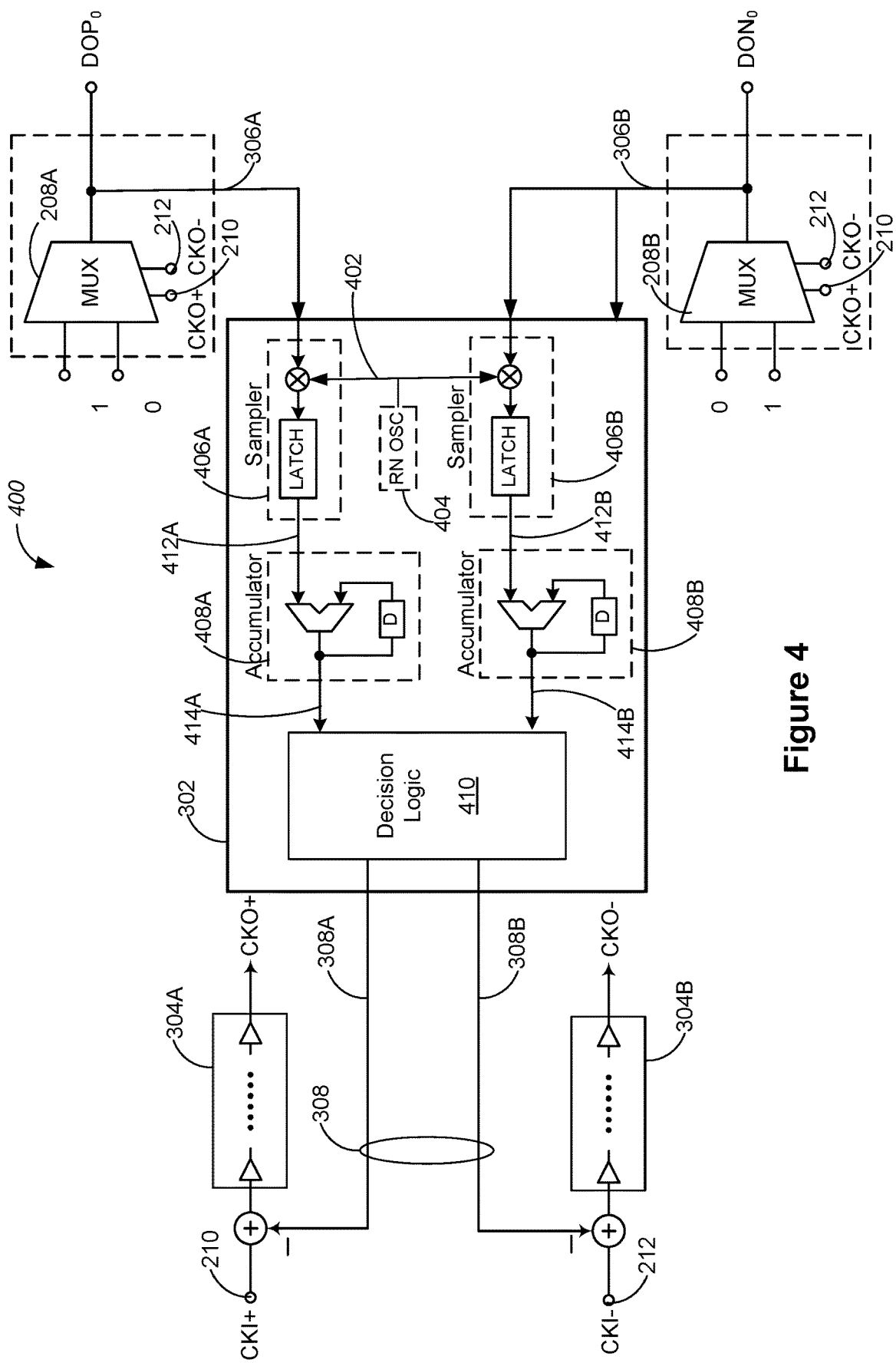
FIG. 4 is a block diagram of another example duty cycle controlling system including a DSP module, in accordance with some embodiments.

FIG. 4 is a block diagram of another example duty cycle controlling system 400 including a DSP module 302, in accordance with some embodiments. The duty cycle controlling system 400 obtains an input clock signal 210 having a first frequency and generates a duty cycle control signal 308 to control distortion of duty cycles of the input clock signal 210 below a duty cycle distortion limit. The duty cycle controlling system 400 includes a first multiplexer 208A, a second multiplexer 208B, the DSP module 302, and two duty cycle modulators 304A and 304B. The first and second multiplexers 208A and 208B replicate multiplexers of a data multiplexing path 200 (FIG. 2), and are configured to generate a first periodic signal 306A that is enabled in each high voltage duty cycle of the input clock signal 210 and a second periodic signal 306B that is enabled in each low voltage duty cycle of the input clock signal 210 (i.e., in each high voltage duty cycle of an inverse clock signal 212). The DSP module 302 converts a pair of differential periodic signals 306 including the first and second periodic signals 306A and 306B to a duty cycle control signal 308. The duty cycle control signal 308 controls the high voltage duty cycles of the input clock signal 210 and the high voltage duty cycles of the inverse clock signal 212.

The DSP module 302 includes a first sampler 406A, a second sampler 406B, a first accumulator 408A, a second accumulator 408B, and a decision logic 410. The samplers 406A and 406B are configured to apply a sampling clock signal 402 to sample high voltage duty cycles and low voltage duty cycles of the input clock signal 210 for a duration of time. The accumulators 408A and 408B track first samples 412A outputted by the samplers 406A and second samples 412B outputted by the samplers 406B accumulatively to generate a first count 414A and a second count 414B. The decision logic 410 determines the duty cycle distortion level of the input clock signal 210 in the duration of time based on the first and second counts 414, and generates a duty cycle control signal 308 to control the high voltage duty cycles of the input clock signal 210 based on the duty cycle distortion level. As such, the DSP module 302 enables a feedback loop to control duty cycle distortion of the input clock signal 210 and the invert clock signal 212.

The sampling clock signal 402 has a second frequency that is lower than the first frequency of the input clock signal 210. In some embodiments, the second frequency of the sampling clock signal 402 is at least two orders of magnitude greater than the first frequency of the input clock signal 210. For example, the first frequency of the input clock signal 210 is 12.5 GHz, and the second frequency of the sampling clock signal 408 is 40 MHz. The sampling clocks signal 402 has a random noise distribution. In an example, the random noise distribution of the sampling clock signal 402 includes a Gaussian distribution centered at the second frequency. In some embodiments, the DSP module 302 receives the sampling clock signal 402 from an external random noise oscillator. In some embodiments, the DSP module 302 includes an internal random noise oscillator 404 configured to generate the sampling cock signal 402.

The first sampler 406A obtains the first periodic signal 306A and the sampling clock signal 402, and applies the sampling clock signal 402 to sample the first periodic signal 306A corresponding to high voltage duty cycles of the input clock signal 210 within the duration of time. The second sampler 406B obtains the second periodic signal 306B and the sampling clock signal 402, and applies the sampling clock signal 402 to sample the first periodic signal 306A corresponding to low voltage duty cycles of the input clock signal 210 within the duration of time. In some embodiments, the duration of time corresponds to more than a predefined number of samples (e.g., 1000 samples), each of which corresponds to a clock cycle of the sampling clock signal 402. For example, the duration of time is 25 μs or 1 ms. In some embodiments, each of the first and second samplers 406A and 406B includes a respective latch configured to sample the first or second periodic signal with each rising edge of the sampling clock signal 402.

The first accumulator 408A determines that the first count 414A of rising edges of the sampling clock signal 402 are synchronous with the high voltage duty cycles of the input clock signal 210 within the duration of time. The second accumulator 408B determines that the second count 414B of rising edges of the sampling clock signal 402 are synchronous with low voltage duty cycles of the input clock signal 210 within the duration of time. In some embodiments, the accumulators 408A and 408B determine the first count 414A and the second count 414B based on falling edges of the sampling clock signals 402. In some embodiments, each of the accumulators 408A and 408B includes a delta-sigma modulator. The duty cycle distortion level of the input clock signal 210 is determined based on a difference between the first count 414A and the second count 414B. For example, in some situations, the first count 414A differs from the second count 414B by less than a threshold count corresponding to the duty cycle distortion limit. The duty cycle distortion level is less than the duty cycle distortion limit, and the duty cycle of the input clock signal 210 does not need to be adjusted. Alternatively, in some situations, the first count 414A differs from the second count 414B by more than the threshold count. The duty cycle distortion level between the high voltage duty cycles and the low voltage duty cycles exceeds the duty cycle distortion limit, and the duty cycle of the input clock signal 210 needs to be adjusted until the duty cycle distortion level drops below the duty cycle distortion limit.

In some embodiments, the decision logic 410 receives the first count 414A and the second count 414B and generates the duty cycle control signal 308 (e.g., including a first duty cycle control signal 308A and a second duty cycle control signal 308B). For example, in some situations, in accordance with a determination that the first count 414A is greater than the second count 414B by more than the threshold count corresponding to the duty cycle distortion limit, the decision logic 410 generates the first duty cycle control signal 308A to reduce the high voltage duty cycles of the input clock signal 310, the second duty cycle control signal 308B to increase the high voltage duty cycles of the inverse clock signal, or both of the first and second duty cycle control signals 308A and 308B. Conversely, in some situations, in accordance with a determination that the first count 414A is less than the second count 410B by more than the threshold count, the decision logic 410 generates the first duty cycle control signal 308A to increase the high voltage duty cycles of the input clock signal 310, the second duty cycle control signal 308B to reduce the high voltage duty cycles of the inverse clock signal, or both of the first and second duty cycle control signals 308A and 308B.

In some embodiments, the first sampler 406A and the first accumulator 408A determine the first count 414A jointly with a first moving average filter (not shown), and the second sampler 406B and the second accumulator 408B determine the second count 414B jointly with a second moving average filter (not shown). In some embodiments, the random noise oscillator 404 is associated with a white sense stationary random process that generates a wide sigma gaussian noise distribution by central limited theorem. The sampling clock signal 402 generated by the random noise oscillator 404 is applied to sample "1" in the first and second periodic signals 306A and 306B. Stated another way, the sampling clock signal 402 samples "1" (high voltage duty cycles) and "0" (low voltage duty cycles) in the input clock signal 210. In some embodiments, an accuracy of a duty cycle distortion level depends on the number of statistics fed into the moving average filters.

In some embodiments, a data rate of USB4 v2.0 is up to 40 Gbps PAM-3 signal on a lane and corresponds to a UI time is 39.0625 ps. Given such a small UI time, duty cycle distortion (i.e., even odd jitter) may exceed a predefined portion of the UI time easily. Particularly, in some situations, the duty cycle controlling system 400 operates at a low clock frequency that is half of a data rate for the purposes of reducing power consumption and enhancing a yield rate. Duty cycle distortion oftentimes exceeds the predefined portion of the UI time in such a duty cycle controlling system 400, which operates at the low clock frequency. In the duty cycle controlling system 400, the DSP module 302 enables a feedback path to control duty cycle distortion dynamically below a duty cycle distortion limit.

FIG. 5A is a temporal diagram 500 showing two periodic signals 306A and 306B, a sampling clock signal 402, and rising edges 502 of the sampling clock signal 402, in accordance with some embodiments. FIG. 5B is a frequency diagram of an example sampling clock signal 402, in accordance with some embodiments. The periodic signals 306A and 306B are generated from the multiplexer 208A and 208B and enabled in response to high voltage duty cycles and low voltage duty cycles of the input clock signal 210, respectively. A second periodic signal 306B is enabled in response to the low voltage duty cycles of the input clock signal 210, i.e., high voltage duty cycles of the inverse clock signal 212 (FIG. 2). The periodic signals 306A and 306B are complementary to each other and have a frequency equal to a first frequency of the input clock signal 210. The sampling clock signal 402 includes a random noise clock signal having a random noise distribution and a second frequency. The second frequency of the sampling clock signal 402 is lower than the first frequency of the input clock signal 210 and the periodic signals 306A and 306B. The sampling clock signal 402 is applied to sample the two periodic signals 306A and 306B for a duration of time, thereby sampling the high voltage duty cycles and the low voltage duty cycles of the input clock signal 210.

The sampling clock signal 402 includes a plurality of rising edges 502 and a plurality of falling edges 504 in the duration of time. Each rising edge 502 is synchronous with a temporal location in a respective high voltage duty cycle of the first periodic signal 306A or the second periodic signal 306B, so is each falling edge 504. Temporal locations of the rising edges 502 of the sampling clock signal 402 vary with respect to immediately adjacent rising edges of the first periodic signal 306A or the second periodic signal 306B, so do temporal locations of the falling edges 504 of the sampling clock signal 402. More specifically, for each rising edge 502 of the sampling clock signal 402, if the respective rising edge 502 is synchronous with a respective high voltage duty cycle of the first periodic signal 306A, the respective rising edge is shifted to a first high voltage duty cycle 506A of the first periodic signal 306A based on a respective temporal location of the rising edge 502 with respect to an immediately adjacent rising edge of the first periodic signal 306A. If the respective rising edge 502 is synchronous with a respective high voltage duty cycle of the second periodic signal 306B, the respective rising edge is shifted to a second high voltage duty cycle 506B of the second periodic signal 306B based on a respective temporal location of the rising edge 502 with respect to an immediately adjacent rising edge of the second periodic signal 306B. During the duration of time, the shifted rising edges of the sampling clock signal 402 are distributed substantially evenly within the duty cycles 506A and 506B because of the random noise distribution of the sampling clock signal 402. As such, the first count 414A and the second count 414B of the rising edges 502 represent temporal width of the high voltage duty cycles 506A and the low voltage duty cycles of the input clock signal 210, respectively.

In other words, the temporal locations of the rising edges 502 of the sampling clock signal 402 are evenly distributed within the corresponding duty cycles 506A and 506B during the duration of time, so are the temporal locations of the falling edges 504 of the sampling clock signal 402. In some embodiments, the rising edges 502 of the sampling clock signal 402 are applied to sample the high voltage duty cycles 506A and 506B during the duration of time. In some embodiments, the falling edges 504 of the sampling clock signal 402 are applied to sample the high voltage duty cycles 506A and 506B during the duration of time. In some embodiments, both the rising edges 502 and the falling edges 504 of the sampling clock signal 402 are applied to sample the high voltage duty cycles 506A and 506B during the duration of time.

Referring to FIG. 5B, in some embodiments, the random noise distribution of the sampling clock signal 402 includes a Gaussian distribution centered at the second frequency. Further, in some embodiments, the second frequency of the sampling clock signal 402 is at least two orders of magnitude greater than the first frequency of the input clock signal 210. For example, the second frequency is 40 MHz, and the first frequency is 12.5 GHz. In some embodiments, the rising edges 502 of the sampling clock signal 402 are applied to sample the high voltage duty cycles 506A and 506B during the duration of time. The duty cycles 506A and 506B are sampled every 25 ns, and 1000 samples are collected during a duration of time 25 μs. If the duty cycles 506A and 506B correspond to 501 and 499 samples, respectively, a minimum duty cycle distortion level detectable by the sampling clock signal 402 (i.e., a resolution of the duty cycle distortion) is 0.2%. In some embodiments, the duration of time is extended to collect more samples to increase the resolution of the duty cycle distortion. In some embodiments, the second frequency of the sampling clock signal 402 is increased to collect more samples during the same duration of time, thereby increasing the resolution of the duty cycle distortion. In some embodiments, the duty cycles 506A and 506B are sampled at both the rising edges 502 and the falling edges 504 of the sampling clock signal 402 during the same duration of time.

Figure 6:
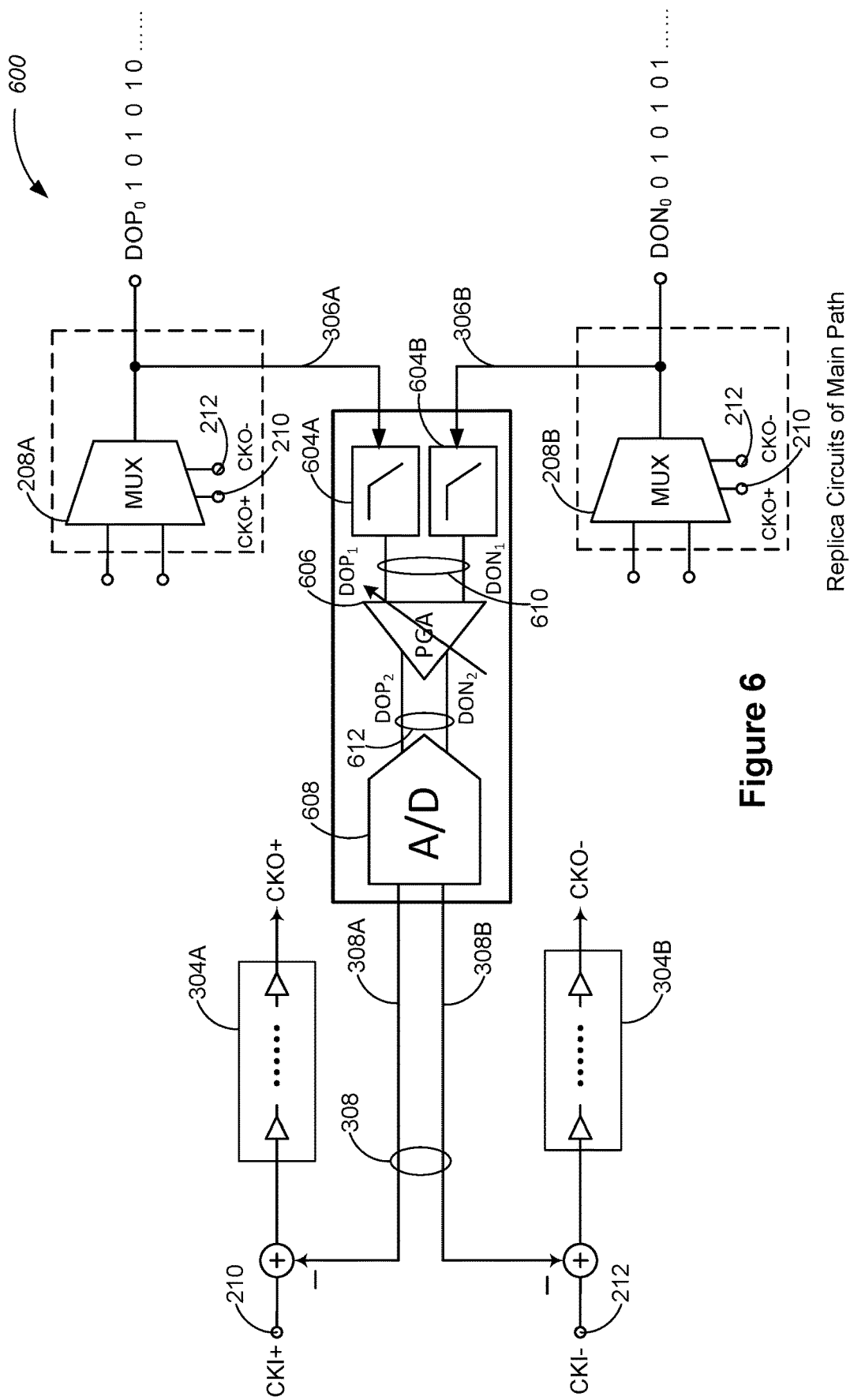
FIG. 6 is a block diagram of an example duty cycle controlling system including a mixed signal processing (MSP) module, in accordance with some embodiments.

FIG. 6 is a block diagram of an example duty cycle controlling system 600 including a mixed signal processing (MSP) module 602, in accordance with some embodiments.

The duty cycle controlling system 600 obtains an input clock signal 210 having a first frequency and generates a duty cycle control signal 308 to control distortion of duty cycles of the input clock signal 210 below a duty cycle distortion limit (e.g., 1% of a UI). The duty cycle controlling system 600 includes a first multiplexer 208A, a second multiplexer 208B, the MSP module 602, and two duty cycle modulators 304A and 304B. The first and second multiplexers 208A and 208B replicate multiplexers of a data multiplexing path 200 (FIG. 2), and are configured to generate a first periodic signal 306A that is enabled in each high voltage duty cycle of the input clock signal 210 and a second periodic signal 306B that is enabled in each low voltage duty cycle of the input clock signal 210. The MSP module 602 converts a pair of differential periodic signals 306 including the first and second periodic signals 306A and 306B to a duty cycle control signal 308. The duty cycle control signal 308 controls high voltage duty cycles of the input clock signal 210 and the high voltage duty cycles of an inverse clock signal 212. In some embodiments, the duty cycle control signal 308 includes a first duty cycle control signal 308A and a second duty cycle control signal 308B for controlling the duty cycles of the input clock signal 210 and the inverse clock signal 212, respectively.

The MSP module 602 includes a first low-pass filter 604A, a second low-pass filter 604B, an amplifier 606, and an ADC 608. The first low-pass filter 604A receives the first periodic signal 306A and filters the first periodic signal 306A to generate a first output voltage DOP1. The first output voltage DOP1 has a first direct current (DC) voltage level indicating, in real time, a first duty cycle length of high voltage duty cycles of the input clock signal 210. The second low-pass filter 604B receives the second periodic signal 306B and filters the second periodic signal 306B to generate a second output voltage DON1. The second output voltage DON1 has a second DC voltage level indicating, in real time, a second duty cycle length of low voltage duty cycles of the input clock signal 210 (i.e., high voltage duty cycles of the inverse clock signal 212). The first output voltage DOP1 and the second output voltage DON1 form an input differential signal 610 that is amplified to an amplified differential signal 612 by the amplifier 606. The amplified differential signal 612 includes a first amplified voltage DOP2 and a second amplified voltage DON2. The ADC 608 is coupled to the amplifier 606 and configured to convert the amplified differential signal 612 to a digital data signal (e.g., the duty cycle control signal 308), which is further applied to control the duty cycle distortion level of the clock signal 210 below the duty cycle distortion limit.

In some embodiments, the first DC voltage level of the first output voltage DOP1 is proportional to the first duty cycle length of high voltage duty cycles of the input clock signal 210, and the second DC voltage level of the second filtered voltage DOP2 is proportional to the second duty cycle length of low voltage duty cycles of the input clock signal 210. The input differential signal 610 is proportional to a difference between the first duty cycle length and the second duty cycle length of the input clock signal 210, i.e., a duty cycle distortion level. In some embodiments, the amplifier 606 includes a programmable gain amplifier (PGA) 606 having a gain. The gain is dynamically adjusted to control the amplified differential signal 612 including the first amplified voltage DOP2 and the second amplified voltage DON2 in a predefined output dynamic range. The amplified differential signal 612 is proportional to the difference between the first duty cycle length and the second duty cycle length of the input clock signal 210, i.e., the duty cycle distortion level.

The duty cycle distortion level of the input clock signal 210 is determined based on a difference between the first output voltage DOP1 and the second output voltage DON1. For example, in some situations, the first output voltage DOP1 differs from the second output voltage DON1 by less than a threshold output voltage corresponding to the duty cycle distortion limit. The duty cycle distortion level is less than the duty cycle distortion limit, and the duty cycle of the input clock signal 210 does not need to be adjusted. Alternatively, in some situations, the first output voltage DOP1 differs from the second output voltage DON1 by more than the threshold output voltage. The duty cycle distortion level between the high voltage duty cycles and the low voltage duty cycles of the input clock signal 210 exceeds the duty cycle distortion limit, and the duty cycle of the input clock signal 210 needs to be adjusted until the duty cycle distortion level drops below the duty cycle distortion limit.

In some embodiments, the ADC 608 receives the first amplified voltage DOP2 and the second amplified voltage DON2 and generates the duty cycle control signal 308 (e.g., including a first duty cycle control signal 308A and a second duty cycle control signal 308B). For example, in some situations, in accordance with a determination that the first amplified voltage DOP2 is greater than the second amplified voltage DON2 by more than a threshold amplified voltage corresponding to the duty cycle distortion limit, the ADC 608 generates the first duty cycle control signal 308A to reduce the high voltage duty cycles of the input clock signal 210, the second duty cycle control signal 308B to increase the high voltage duty cycles of the inverse clock signal 212, or both of the first and second duty cycle control signals 308A and 308B. The threshold amplified voltage is equal to a product of the gain of the amplifier 606 and the threshold output voltage. Conversely, in some situations, in accordance with a determination that the first amplified voltage DOP2 is less than the second amplified voltage DON2 by more than the threshold amplified voltage, the ADC 608 generates the first duty cycle control signal 308A to increase the high voltage duty cycles of the input clock signal 210, the second duty cycle control signal 308B to reduce the high voltage duty cycles of the inverse clock signal 212, or both of the first and second duty cycle control signals 308A and 308B.

Figure 7:
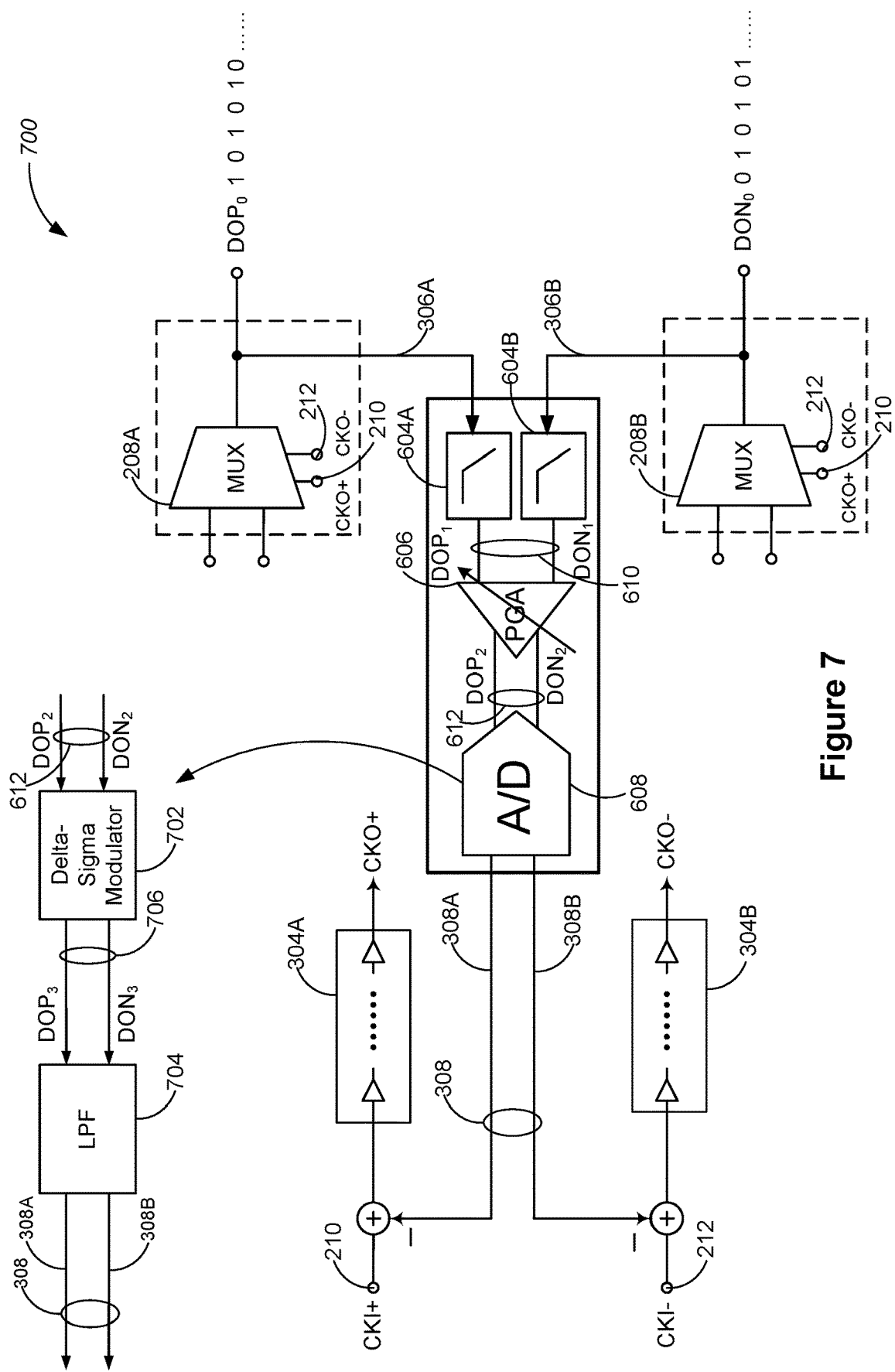
FIG. 7 is a block diagram of another example duty cycle controlling system including an MSP module, in accordance with some embodiments.

FIG. 7 is a block diagram of another example duty cycle controlling system 700 including an MSP module 602, in accordance with some embodiments. The duty cycle controlling system 700 obtains an input clock signal 210 having a first frequency and generates a duty cycle control signal 308 to control distortion of the high voltage duty cycles of the input clock signal 210 below a duty cycle distortion limit (e.g., 1% of a UI time). The duty cycle controlling system 700 includes a first multiplexer 208A, a second multiplexer 208B, the MSP module 602, and two duty cycle modulators 304A and 304B. The first and second multiplexers 208A and 208B generates a first periodic signal 306A that is enabled in each high voltage duty cycle of the input clock signal 210 and a second periodic signal 306B that is enabled in each low voltage duty cycle of the input clock signal 210. The MSP module 602 converts a pair of differential periodic signals 306 including the first and second periodic signals 306A and 306B to a duty cycle control signal 308.

In some embodiments, the MSP module 602 includes a first low-pass filter 604A, a second low-pass filter 604B, an amplifier 606, and an ADC 608. The first low-pass filter 604A and the second low-pass filter 604B generate a first output voltage DOP1 and a second output voltage DON1, forming an input differential signal 610 that is amplified to an amplified differential signal 612 by the amplifier 606. The amplified differential signal 612 includes a first amplified voltage DOP2 and a second amplified voltage DON2. The ADC 608 is coupled to the amplifier 606 and configured to convert the amplified differential signal 612 to the duty cycle control signal 308, which is further applied to control a duty cycle distortion level of the input clock signal 210 below a duty cycle distortion limit.

In some embodiments, the ADC 608 includes a delta-sigma modulator 702 and a low-pass filter 704. The delta-sigma modulator 702 receives the first amplified voltage DOP2 and the second amplified voltage DON2, and generates a first modulated voltage DOP3 and a second modulated voltage DON3, forming a differential modulated signal 706. The low-pass filter 704 further filters the differential modulated signal 706 and generates the duty cycle control signal 308. Application of the delta-sigma modulator 702 of the ADC 608 enables a high resolution and high accuracy converter that reduces an quantization error, thereby conveniently controlling the duty cycle distortion level below the duty cycle distortion limit (e.g., 1% of the UI time).

FIGS. 8A-8C are temporal diagrams of a sequence of differential signals in an MSP module 602 of a duty cycle controlling system shown in FIG. 6, in accordance with some embodiments. A first periodic signal 306A corresponds to high voltage duty cycles of the input clock signal 210, and is filtered to generate a first output voltage DOP1. The first output voltage DOP1 has a first direct current (DC) voltage level indicating, in real time, a first duty cycle length of the high voltage duty cycles of the input clock signal 210. A second periodic signal 306B corresponds to high voltage duty cycles of the inverse clock signal 212 (i.e., low voltage duty cycles of the input clock signal 210). A common mode voltage VCM is an average of the first and second output voltages DOP1 and DON1. The first output voltage DOP1 and the second output voltage DON1 form an input differential signal 610 that is amplified to an amplified differential signal 612 by the amplifier 606. The amplified differential signal 612 includes a first amplified voltage DOP2 and a second amplified voltage DON2.

In some embodiments, the first output voltage DOP1 differs from (e.g., is greater than or less than) the second output voltage DON1 by more than a threshold output voltage (e.g., 0.05V) corresponding to a duty cycle distortion limit (e.g., 1%). The first amplified voltage DOP2 differs from (e.g., is greater than or less than) the second amplified voltage DON2 by more than a threshold amplified voltage (e.g., 0.5V) corresponding to the duty cycle distortion limit (e.g., 1%). The threshold amplified voltage is a product of the threshold output voltage and a gain of the amplifier 606. As the duty cycle distortion level of the input clock signal 210 is controlled to be within the duty cycle distortion limit, the first output voltage DOP1 differs from the second output voltage DON1 by a voltage less than the threshold output voltage, and the first amplified voltage DOP2 differs from the second amplified voltage DON2 by a voltage less than the threshold output voltage. Temporal lengths of the high voltage duty cycles of the periodic signals 306A an 306B are equal to each other or differ from each other with the duty cycle distortion limit. As such, the temporal lengths of the high voltage and low voltage duty cycles of the input clock signals 510 are adjusted to be equal to each other or differ from each other with the duty cycle distortion limit.

Referring to FIGS. 8A-8C, in an example, high voltage duty cycles of the input clock signal 210 are greater than 50% (i.e., longer than low voltage duty cycles of the input clock signal 210). The first output voltage DOP1 is greater than the second output voltage DON1. The first amplified voltage DOP2 is greater than the second amplified voltage DON2 by a threshold amplified voltage, which is a product of the threshold output voltage and a gain of the amplifier 606. The duty cycle control signal 308 controls the high voltage duty cycles of the input clock signal 210 to drop to 50% and the low voltage duty cycles of the input clock signal 210 to increase to 50%, such that the high voltage duty cycles and low voltage duty cycles of the input clock signal 210 are equal to each other. The first output voltage DOP1 drops gradually, and the second output voltage DON1 increase gradually, until the first output voltage DOP1 is equal to the second output voltage DON1. The first amplified voltage DOP2 drops gradually, and the second amplified voltage DON2 increase gradually, until the first amplified voltage DOP2 is equal to the second amplified voltage DON2. Temporal lengths of the high voltage duty cycles of the periodic signals 306A an 306B start with T1 and T2, where T1 is greater than T2, and are controlled to be equal to ½T.

FIGS. 9A-9E are temporal diagrams of a sequence of differential signals in an MSP module 602 of a duty cycle controlling system shown in FIG. 7, in accordance with some embodiments. In some embodiments, the ADC 608 includes a delta-sigma modulator 702 and a low-pass filter 704. The delta-sigma modulator 702 receives the first amplified voltage DOP2 and the second amplified voltage DON2 and generates a first modulated voltage DOP3 and a second modulated voltage DON3, forming a differential modulated signal 706. The low-pass filter 704 further filters the differential modulated signal 706 and generates the duty cycle control signal 308 including a first duty cycle control signal 308A (DOP4) and a second duty cycle control signal 308B (DON4).

Temporal lengths (FIG. 9E, $T_1$ and $T_2$) of the high voltage duty cycles of the periodic signals 306A an 306B differ from each other, so do temporal lengths of the high voltage and low voltage duty cycles of the input clock signal 510. A corresponding duty cycle difference of the input clock signal 510 is within the duty cycle distortion limit. The first output voltage DOP1 (FIG. 9A) differs from (e.g., is greater than or less than) the second output voltage DON1 by a voltage less than a threshold output voltage (e.g., 0.05V) corresponding to the duty cycle distortion limit (e.g., 1%). The first amplified voltage DOP2 (FIG. 9B) differs from (e.g., is greater than or less than) the second amplified voltage DON2 by a voltage less than a threshold amplified voltage (e.g., 0.5V) that corresponds to the duty cycle distortion limit (e.g., 1%). The first modulated voltage DOP3 and the second modulated voltage DON3 (FIG. 9C) are outputted by the delta-sigma modulator 702.

Figure 10A:
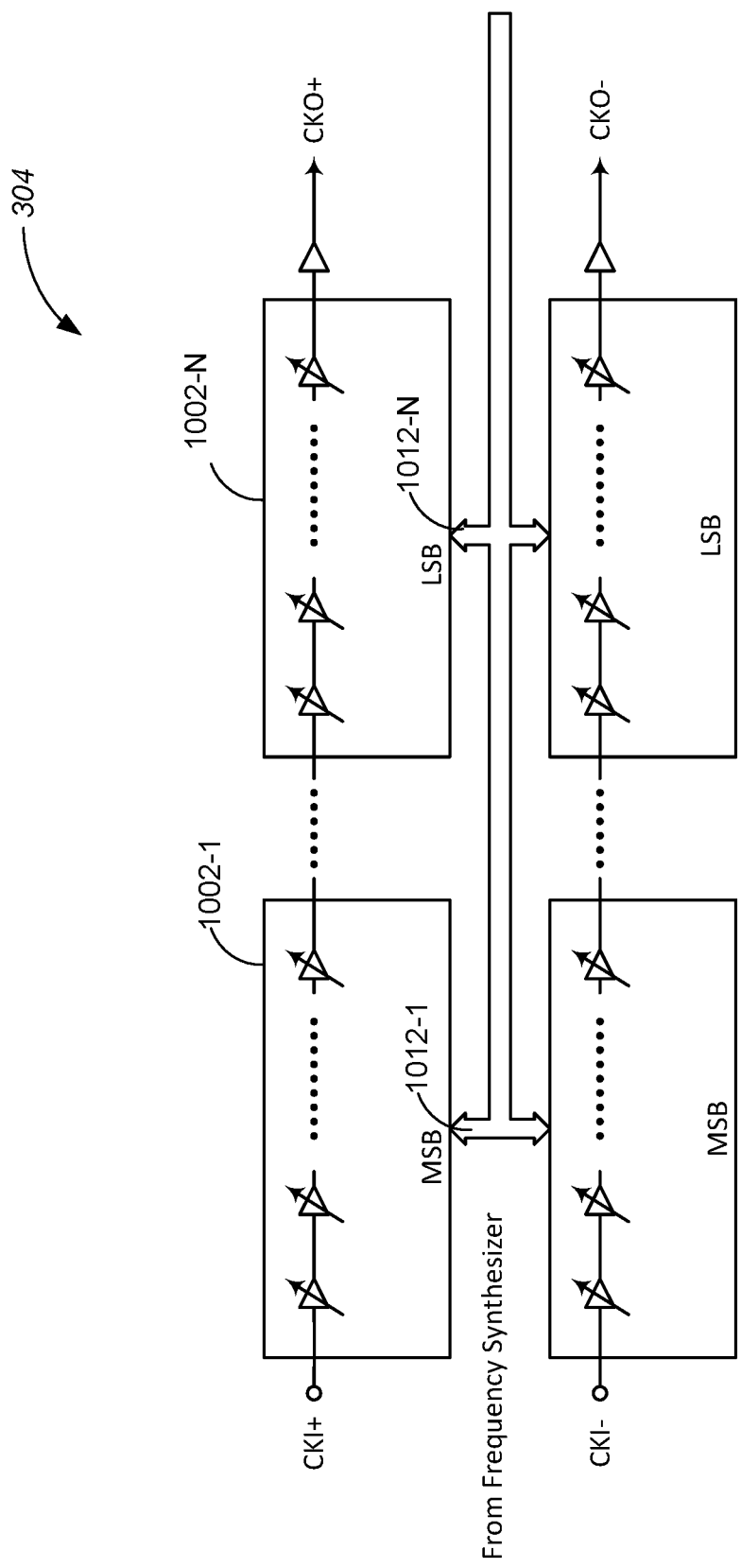
FIG. 10A is a block diagram of an example duty cycle modulator configured to provide a plurality of delay times using a plurality of buffers, in accordance with some embodiments.
Figure 10B:
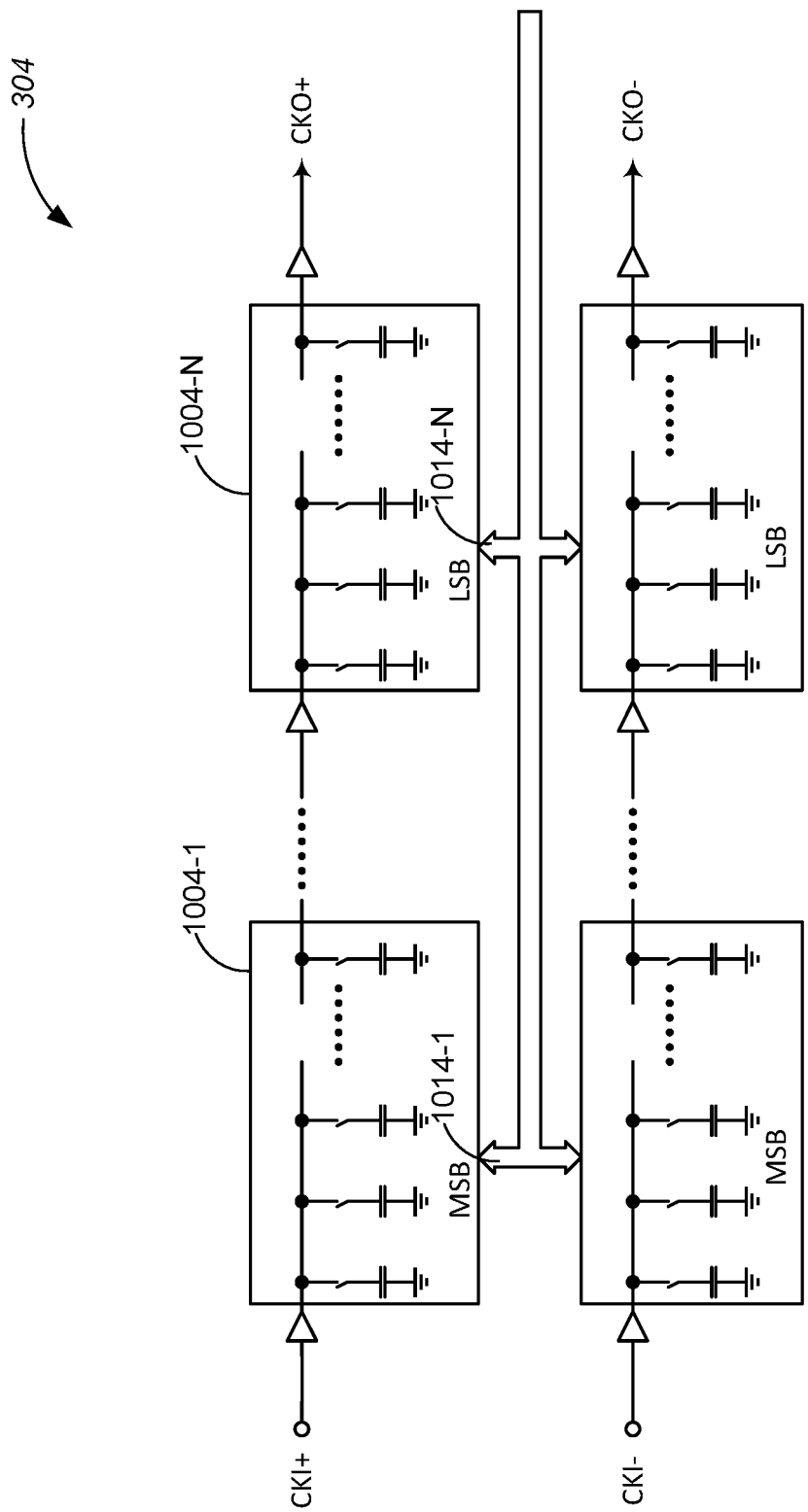
FIG. 10B is a block diagram of another example duty cycle modulator configured to provide a plurality of delay times using a plurality of load capacitors, in accordance with some embodiments.
Figure 10C:
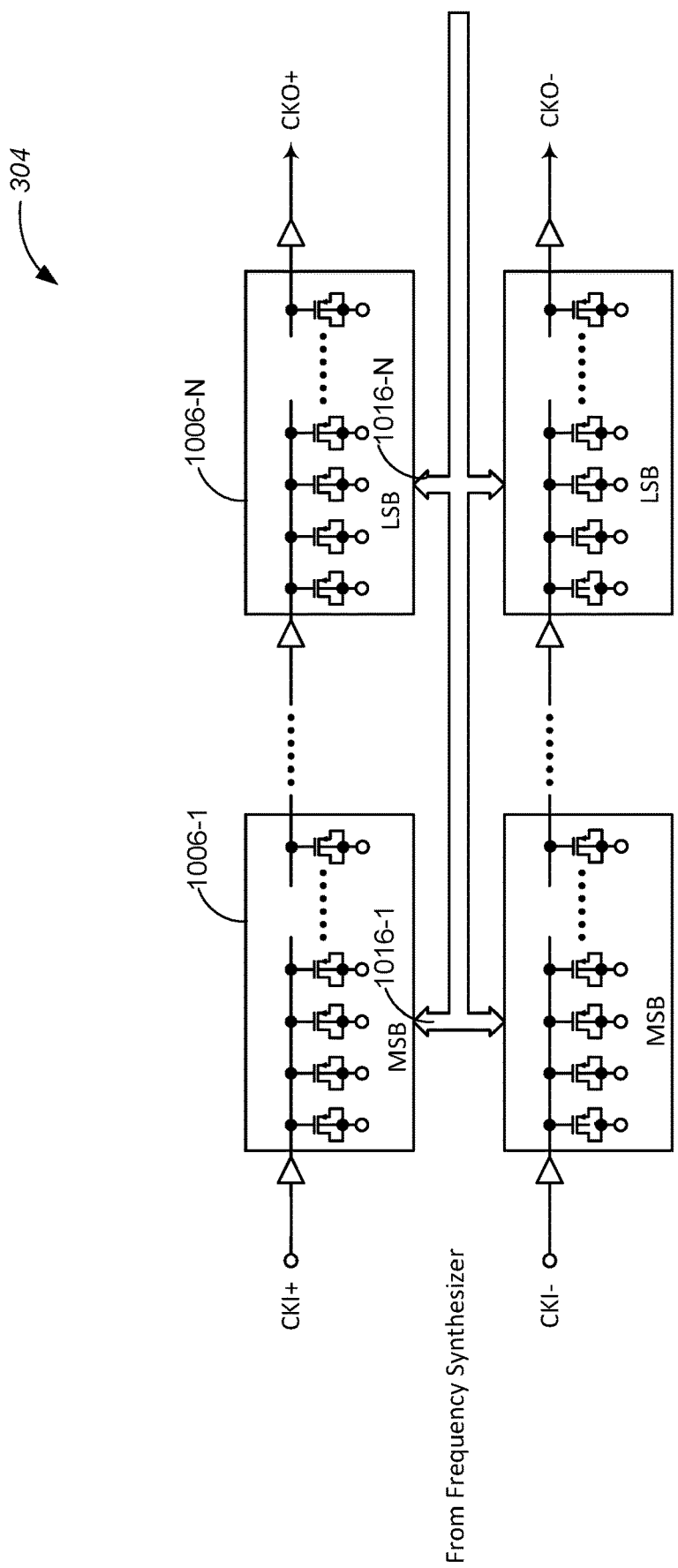
FIG. 10C is a block diagram of another example duty cycle modulator configured to provide a plurality of delay times using a plurality of transistors 1006, in accordance with some embodiments.

FIG. 10A is a block diagram of an example duty cycle modulator 304 configured to provide a plurality of delay times using a plurality of buffers 1002, in accordance with some embodiments. FIG. 10B is a block diagram of another example duty cycle modulator 304 configured to provide a plurality of delay times using a plurality of load capacitors 1004, in accordance with some embodiments. FIG. 10C is a block diagram of another example duty cycle modulator 304 configured to provide a plurality of delay times using a plurality of transistors 1006, in accordance with some embodiments.

In some embodiments, the duty cycle control signal 308 includes a multi-bit digital control signal. The duty cycle (i.e., representing the high voltage duty cycle) of the input clock signal 210 is controlled by selecting a first delay time of a first plurality of delay times for the input clock signal by the multi-bit digital control signal. Further, in some embodiments, the input clock signal 210 corresponds to an inverse clock signal 212 that is substantially complementary to the input clock signal 210. The duty cycle (i.e., representing the high voltage duty cycle) of the inverse clock signal 212 is controlled by selecting a second delay time of a second plurality of delay times for the inverse clock signal 212 by the multi-bit digital control signal. In some situations, a variation of the duty cycle of the input clock signal 210 is determined based on the first delay time, and a variation of the duty cycle of the inverse clock signal 212 is determined based on the second delay time. For example, the high voltage duty cycle of the input clock signal 210 increases by the first delay time, and the high voltage duty cycle of the inverse clock signal 212 decreases by the second delay time. The first delay time is equal to the second delay time.

Referring to FIG. 10A, in some embodiments, the input clock signal 210 is driven by a plurality of parallel buffers 1002. The first delay time is selected by selecting a corresponding subset of the plurality of parallel buffers 1002 configured to deliver a respective drive current that enables the first delay time for the input clock signal 210. The first duty cycle control signal 308A has N bits and includes a most significant bit 1012-1 and a least significant bit 1012-N. In an example, the most significant bit 1012-1 is configured to select a first buffer 1002-1 that provides a first drive current, and the least significant bit 1012-N is configured to select an N-th buffer 1002-N that provides an N-th drive current. The N-th drive current is $2^{N-1}$ times of the first drive current, and a corresponding most significant delay is $2^{N-1}$ times of a corresponding least significant delay. In another example, the plurality of parallel buffers 1002 are identical, and each buffer 1002 provides a predefined drive current. A subset of the plurality of parallel buffers 1002 are selected by the N bits of the first duty cycle control signal 308A to enable the first delay time.

Referring to FIG. 10B, in some embodiments, the input clock signal 210 is coupled to a plurality of load capacitors 1004. The first duty cycle control signal 308A is applied to select a corresponding subset of the plurality of load capacitors 1004 to be coupled to the input clock signal 210, thereby creating respective load capacitance that enables the first delay time for the input clock signal. The first duty cycle control signal 308A has N bits and includes a most significant bit 1014-1 and a least significant bit 1014-N. In an example, the most significant bit 1014-1 is configured to select a first load capacitor 1004-1 that provides first load capacitance, and the least significant bit 1014-N is configured to select an N-th load capacitor 1004-N that provides N-th load capacitance. The first load capacitance is $2^{N-1}$ times of the N-th load capacitance, and a corresponding most significant delay is $2^{N-1}$ times of a corresponding least significant delay. In another example, the plurality of load capacitors 1004 are identical, and each load capacitor 1004 provides a predefined load capacitance. A subset of the plurality of load capacitors 1004 are selected by the N bits of the first duty cycle control signal 308A to enable the first delay time.

Referring to FIG. 10C, in some embodiments, the input clock signal 210 is coupled to a plurality of transistor devices 1006. Each transistor device 1006 is coupled to form a load capacitor having a first electrode and a second electrode. Each transistor 1006 has a source, a drain, a gate, and a body. The gate of each transistor device 1006 is coupled to the first electrode, and the source, drain, and body of the transistor device 1006 are shorted and coupled to the second electrode. Each transistor device 1006 has a transistor width and a transistor length, and load capacitance of the load capacitor is proportional to a transistor area that is substantially equal to a product of the transistor width and the transistor length. The first duty cycle control signal 308A is applied to select a corresponding subset of the plurality of transistor devices 1006 to be coupled to the input clock signal 210, thereby creating respective load capacitance that enables the first delay time for the input clock signal 210. The first duty cycle control signal 308A has N bits and includes a most significant bit 1016-1 and a least significant bit 1016-N. In an example, the most significant bit 1016-1 is configured to select a first transistor device 1006-1 that provides first load capacitance, and the least significant bit 1016-N is configured to select an N-th transistor device 1006-N that provides N-th load capacitance. The first load capacitance is $2^{N-1}$ times of the N-th load capacitance, and a corresponding most significant delay is $2^{N-1}$ times of a corresponding least significant delay. In another example, the plurality of transistor devices 1006 are identical, and each transistor device 1006 provides a predefined load capacitance. A subset of the plurality of transistor devices 1006 are selected by the N bits of the first duty cycle control signal 308A to enable the first delay time.

In some embodiments, the input clock signal 210 is coupled to a plurality of successive buffer stages. Each buffer stage includes a plurality of parallel buffers and a plurality of parallel load capacitors. A subset of the plurality of successive buffer stages is selected to be adjusted based on the multi-bit digital control signal. For each selected buffer stage, a respective subset of buffers and a respective subset of load capacitors are selected, such that the plurality of successive buffer stages enable the first delay time for the input clock signal 210.

Figure 10D:
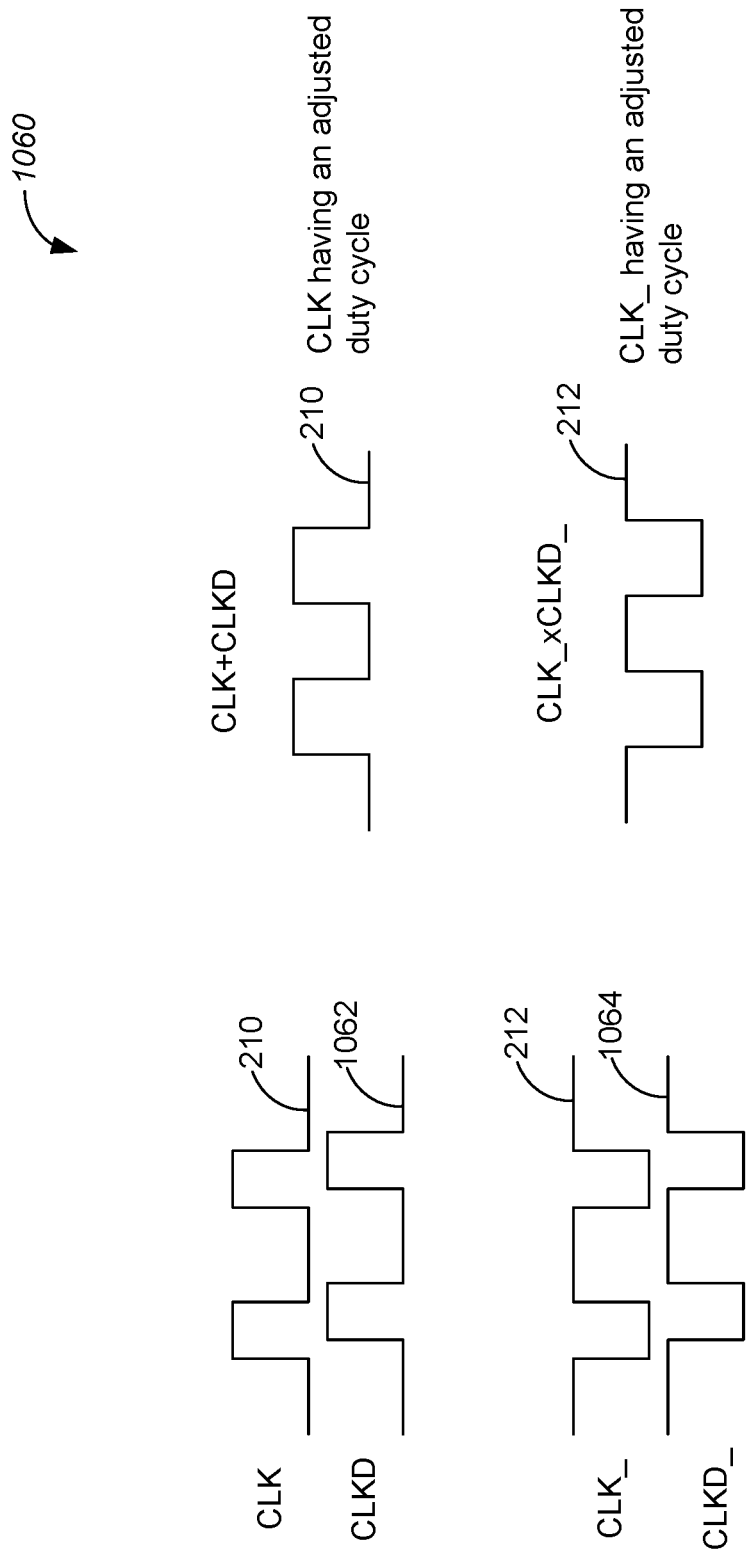
FIG. 10D is a temporal diagram of clock related signals that are combined to control duty cycle distortion, in accordance with some embodiments.

FIG. 10D is temporal diagrams of clock related signals 1060 that are combined to control duty cycle distortion, in accordance with some embodiments. An input clock signal 210 has a duty cycle distortion level. A duty cycle control signal 308 controls the input clock signal 210 (CLK) to be delayed by a first delay time and generate a delayed clock signal 1062 (CLKD). The input clock signal 210 (CLK) and the delayed clock signal 1062 (CLKD) are combined to adjust the duty cycle of the input clock signal 210. For example, the input clock signal 210 (CLK) and the delayed clock signal 1062 (CLKD) are combined by an OR gate to increase the duty cycle (i.e., high voltage duty cycle) of the input clock signal 210. The input clock signal 210 (CLK) and the delayed clock signal 1062 (CLKD) are combined by an AND gate to decrease the duty cycle of the input clock signal 210.

An inverse clock signal 212 (CLK_) is complementary to an input clock signal 210. The duty cycle control signal 308 controls the inverse clock signal 212 (CLK_) to be delayed by a second delay time and generate a delayed inverse clock signal 1064 (CLKD_). The inverse clock signal 212 (CLK_) and the delayed inverse clock signal 1064 (CLKD_) are combined to adjust the duty cycle of the inverse clock signal 212. For example, the inverse clock signal 212 (CLK_) and the delayed inverse signal 1064 (CLKD_) are combined by an AND gate to decrease the duty cycle (i.e., high voltage duty cycle) of the inverse clock signal 212. The inverse clock signal 212 (CLK_) and the delayed inverse clock signal 1064 (CLKD_) are combined by an OR gate to increase the duty cycle of the inverse clock signal 212. After duty cycle adjustment, the inverse clock signal 212 remains complementary to the input clock signal 210.

Figure 11:
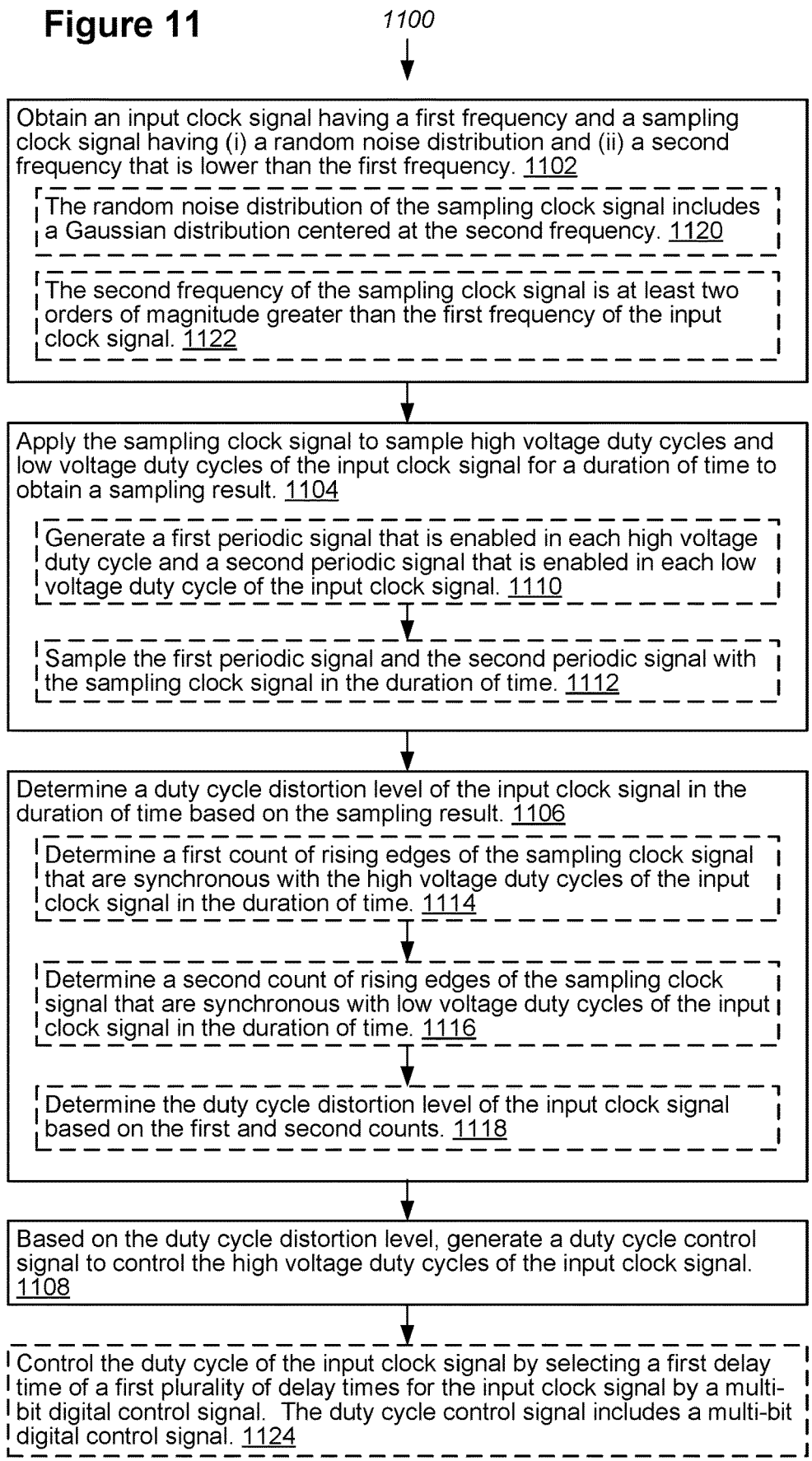
FIG. 11 is a flow diagram of an example method for controlling duty cycle distortion of clock signals, in accordance with some embodiments.

FIG. 11 is a flow diagram of an example method 1100 for controlling duty cycle distortion of clock signals, in accordance with some embodiments. An electronic device obtains (1102) an input clock signal 210 having a first frequency and a sampling clock signal 402 (FIG. 4) having (i) a random noise distribution and (ii) a second frequency that is lower than the first frequency. The sampling clock signal 402 is applied (1104) to sample high voltage duty cycles and low voltage duty cycles of the input clock signal 210 for a duration of time to obtain a sampling result. In an example, the duration of time is 100 ms. The electronic device determines (1106) a duty cycle distortion level of the input clock signal 210 in the duration of time based on the sampling result. Based on the duty cycle distortion level, the electronic device generates (1108) a duty cycle control signal 308 to control the high voltage duty cycles of the input clock signal 210.

In some embodiments, the electronic device generates (1110) a first periodic signal 306A (FIG. 4) that is enabled in each high voltage duty cycle and a second periodic signal 306B that is enabled in each low voltage duty cycle of the input clock signal 210. The electronic device samples (1112) the first periodic signal 306A and the second periodic signal 306B with the sampling clock signal 402 in the duration of time. Further in some embodiments, the first periodic signal 306A and the sampling clock signal 402 are combined by a first XOR logic and a first latch (FIG. 4) to generate first samples 412A (FIG. 4) that indicates whether each rising edge of the sampling clock signal 402 is synchronous with the high voltage duty cycles of the input clock signal 210 in the duration of time. The first samples 412A are accumulated to determine that a first count 414A (FIG. 4) of rising edges of the sampling clock signal 402 are synchronous with the high voltage duty cycles of the input clock signal 210 in the duration of time. Similarly, second samples 412B (FIG. 4) are obtained and accumulated to determine that a second count 414B (FIG. 4) of rising edges of the sampling clock signal 402 are synchronous with the low voltage duty cycles of the input clock signal 210 in the duration of time. The sampling result include one or more of: the first samples 412A, the second samples 412B, the first count 414A, the second count 414B, and a difference of the first and second counts 414A and 414B.

In some embodiments, the electronic device determines (1114) that a first count 414A of rising edges of the sampling clock signal 402 (FIG. 5A) are synchronous with the high voltage duty cycles of the input clock signal 210 in the duration of time. The electronic device determines (1116) that a second count 414B of rising edges of the sampling clock signal 402 are synchronous with low voltage duty cycles of the input clock signal 210 in the duration of time. The duty cycle distortion level of the input clock signal 210 is determined (1118) based on the first and second counts 414A and 414B. Further, in some embodiments, the input clock signal 210 corresponds to an inverse clock signal 212 that is substantially complementary to the input clock signal 210. In accordance with a determination that the first count 414A is greater than the second count 414B by more than a threshold count, the electronic device implements at least one of: reducing the high voltage duty cycles of the input clock signal 210 based on the duty cycle control signal 308 and increasing high voltage duty cycles of the inverse clock signal 212 based on the duty cycle control signal 308. In some embodiments, in accordance with a determination that the first count 414A is less than the second count 414B by more than a threshold count, the electronic device implements at least one of: increasing the high voltage duty cycles of the input clock signal 210 based on the duty cycle control signal 308 and reducing high voltage duty cycles of the inverse clock signal 212 based on the duty cycle control signal 308.

In some embodiments (FIG. 5B), the random noise distribution of the sampling clock signal 402 includes (1120) a Gaussian distribution centered at the second frequency.

In some embodiments, the second frequency of the sampling clock signal 402 is (1122) at least two orders of magnitude greater than the first frequency of the input clock signal 210.

In some embodiments, the duty cycle control signal 308 includes a multi-bit digital control signal. The electronic device controls (1124) the duty cycle of the input clock signal 210 by selecting a first delay time of a first plurality of delay times for the input clock signal 210 by the multi-bit digital control signal. Further, in some embodiments, the input clock signal 210 corresponds to an inverse clock signal 212 that is substantially complementary to the input clock signal 210. The electronic device controls the duty cycle of the inverse clock signal 212 by selecting a second delay time of a second plurality of delay times for the inverse clock signal 212 by the multi-bit digital control signal. In some embodiments, the input clock signal 210 is driven by a plurality of parallel buffers 1002 (FIG. 10A). The first delay time is selected by selecting a corresponding subset of the plurality of parallel buffers configured to deliver a respective drive current that enables the first delay time for the input clock signal 210. In some embodiments, the input clock signal 210 is coupled to a plurality of parallel load capacitors 1004 (FIG. 10B). The first delay time is selected by selecting and coupling a corresponding subset of the plurality of parallel load capacitors 1004 configured to create respective load capacitance that enables the first delay time for the input clock signal 210. Further, in some embodiments, each load capacitor has a first electrode and a second electrode, and is formed from a transistor device 1006 (FIG. 10C) having a source, a drain, a gate, and a body. The gate is coupled to the first electrode, and the source, drain, and body of the transistor device are shorted and coupled to the second electrode.

In some embodiments, the input clock signal 210 is coupled to a plurality of successive buffer stages, each buffer stage including a plurality of parallel buffers and a plurality of parallel load capacitors. Based on the multi-bit digital control signal, the electronic device selects a subset of the plurality of successive buffer stages to be adjusted. For each selected buffer stage, the electronic device selects a respective subset of buffers and a respective subset of load capacitors, such that the plurality of successive buffer stages enable the first delay time for the input clock signal 210.

In some embodiments, the duty cycle control signal 308 is generated to control the duty cycle distortion level of the input clock signal 210 to no greater than 1% of a unit interval of the input clock signal 210.

Figure 12:
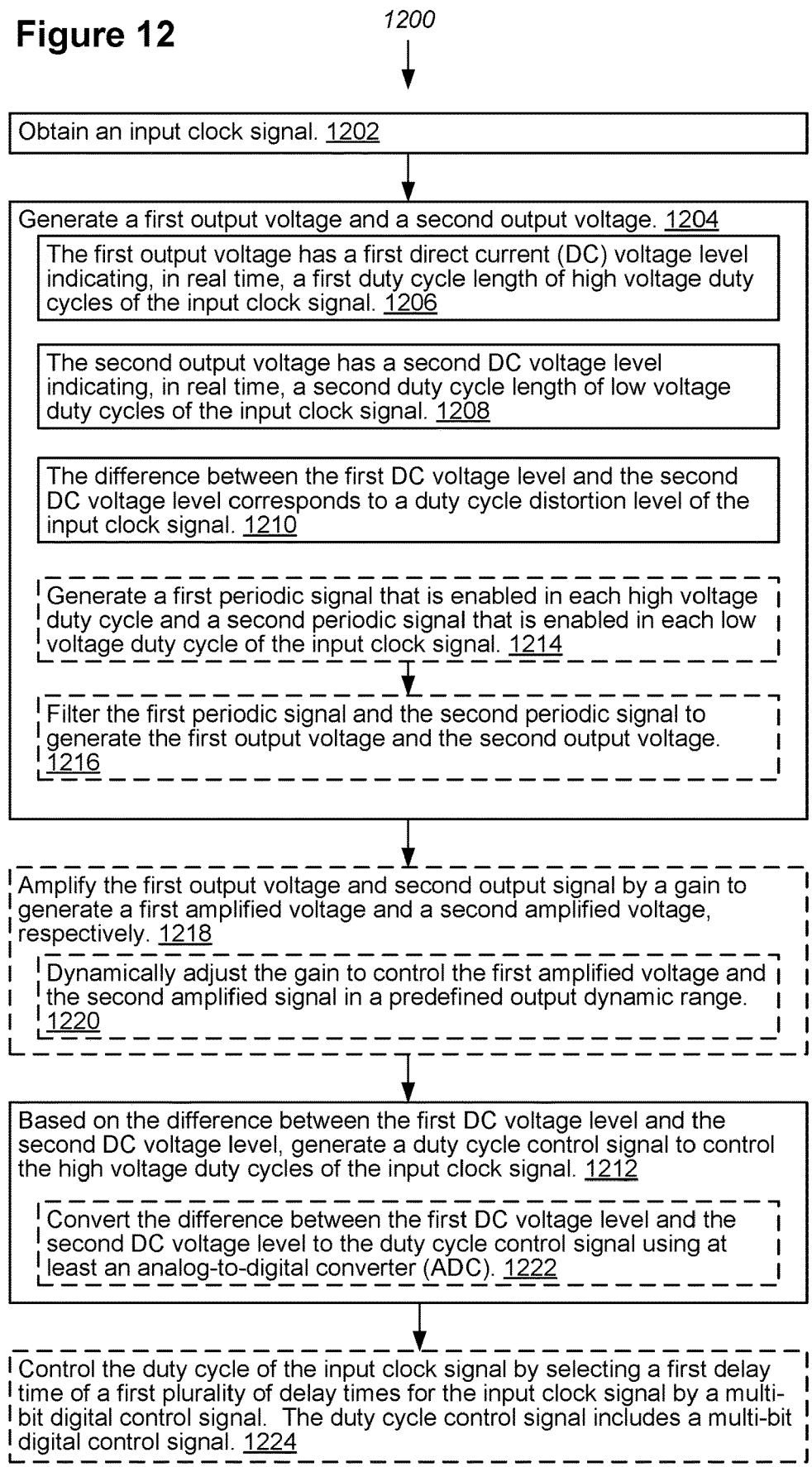
FIG. 12 is a flow diagram of another example method for controlling duty cycle distortion of clock signals, in accordance with some embodiments.

FIG. 12 is a flow diagram of another example method 1200 for controlling duty cycle distortion of clock signals, in accordance with some embodiments. An electronic device obtains (1202) an input clock signal 210 (FIG. 6) and generates (1204) a first output voltage DOP1 and a second output voltage DON1 (FIG. 6) from the input clock signal 210. The first output voltage DOP1 has (1206) a first direct current (DC) voltage level indicating, in real time, a first duty cycle length of high voltage duty cycles of the input clock signal 210. The second output voltage DON1 has (1208) a second DC voltage level indicating, in real time, a second duty cycle length of low voltage duty cycles of the input clock signal 210. A difference between the first DC voltage level and the second DC voltage level corresponds (1210) to a duty cycle distortion level of the input clock signal 210. Based on the difference between the first DC voltage level and the second DC voltage level, the electronic device generates (1212) a duty cycle control signal 308 to control the high voltage duty cycles of the input clock signal 210.

In some embodiments, the electronic device generates (1214) a first periodic signal 306A (FIG. 6) that is enabled in each high voltage duty cycle and a second periodic signal 306B (FIG. 6) that is enabled in each low voltage duty cycle of the input clock signal 210. A first low-pass filter 604A (FIG. 6) is applied to filter (1216) the first periodic signal 306A and generate a first output voltage DOP1. A second low-pass filter 604B (FIG. 6) is applied to filter the second periodic signal 306B and generate a second output voltage DON1. Further, in some embodiments, the electronic device amplifies (1218) the first output voltage DOP1 and second output signal DON1 by a gain to generate a first amplified voltage DOP2 and a second amplified voltage DON2, respectively. Additionally, in some embodiments, the gain is adjusted dynamically (1220) to control the first amplified voltage DOP2 and the second amplified signal DON2 in a predefined output dynamic range.

In some embodiments, the difference between the first DC voltage level and the second DC voltage levels is converted (1222) to the duty cycle control signal 308 using at least an ADC 608 (FIG. 6).

In some embodiments, the input clock signal 210 corresponds to an inverse clock signal 212 that is substantially complementary to the input clock signal 210. In accordance with a determination that the first DC voltage level is greater than the second DC voltage level by at least a threshold output voltage, the electronic device implements at least one of: reducing the high voltage duty cycles of the input clock signal 210 based on the duty cycle control signal 308 and increasing high voltage duty cycles of the inverse clock signal 212 based on the duty cycle control signal 308.

In some embodiments, the input clock signal 210 corresponds to an inverse clock signal 212 that is substantially complementary to the input clock signal 210. In accordance with a determination that the second DC voltage level is greater than the first DC voltage level by at least a threshold output voltage, the electronic device implements at least one of: increasing the high voltage duty cycles of the input clock signal 210 based on the duty cycle control signal 308 and decreasing high voltage duty cycles of the inverse clock signal 212 based on the duty cycle control signal 308.

In some embodiments, the duty cycle control signal 308 includes a multi-bit digital control signal. The electronic device controls (1224) the duty cycle of the input clock signal 210 by selecting a first delay time of a first plurality of delay times for the input clock signal 210 by the multi-bit digital control signal. Further, in some embodiments, the input clock signal 210 corresponds to an inverse clock signal 212 that is substantially complementary to the input clock signal 210. The electronic device controls the duty cycle of the inverse clock signal 212 by selecting a second delay time of a second plurality of delay times for the inverse clock signal 212 by the multi-bit digital control signal. In some embodiments, the input clock signal 210 is driven by a plurality of parallel buffers 1002 (FIG. 10A). The first delay time is selected by selecting a corresponding subset of the plurality of parallel buffers configured to deliver a respective drive current that enables the first delay time for the input clock signal 210. In some embodiments, the input clock signal 210 is coupled to a plurality of parallel load capacitors 1004 (FIG. 10B). The first delay time is selected by selecting and coupling a corresponding subset of the plurality of parallel load capacitors 1004 configured to create respective load capacitance that enables the first delay time for the input clock signal 210. Further, in some embodiments, each load capacitor has a first electrode and a second electrode, and is formed from a transistor device 1006 (FIG. 10C) having a source, a drain, a gate, and a body. The gate is coupled to the first electrode, and the source, drain, and body of the transistor device are shorted and coupled to the second electrode.

In some embodiments, the input clock signal 210 is coupled to a plurality of successive buffer stages, each buffer stage including a plurality of parallel buffers and a plurality of parallel load capacitors. Based on the multi-bit digital control signal, the electronic device selects a subset of the plurality of successive buffer stages to be adjusted. For each selected buffer stage, the electronic device selects a respective subset of buffers and a respective subset of load capacitors, such that the plurality of successive buffer stages enable the first delay time for the input clock signal 210.

In some embodiments, the duty cycle control signal 308 is generated to control the duty cycle distortion level of the input clock signal 210 to no greater than 1% of a unit interval of the input clock signal 210.

In some embodiments, the methods 1100 and 1200 are, optionally, governed by instructions that are stored in a non-transitory computer readable storage medium and that are executed by one or more processors (e.g., a controller) of an electronic device (e.g., a driver device). Each of the operations shown in FIGS. 11 and 12 may correspond to instructions stored in a memory or non-transitory computer readable storage medium. The computer readable storage medium may include a magnetic or optical disk storage device, solid state storage devices such as Flash memory, or other non-volatile memory device or devices. The instructions stored on the computer readable storage medium may include one or more of: source code, assembly language code, object code, or other instruction format that is interpreted by one or more processors. Some operations in methods 1100 and 1200 may be combined and/or the order of some operations may be changed.

It should be understood that the particular order in which the operations in FIGS. 11 and 12 have been described are merely exemplary and are not intended to indicate that the described order is the only order in which the operations could be performed. One of ordinary skill in the art would recognize various ways to control duty cycles of clock signals during data transmission as described herein. Additionally, it should be noted that details of other processes and structures described above with respect to FIGS. 1-10 are also applicable in an analogous manner to methods 1100 and 1200 described above with respect to FIGS. 11 and 12. For brevity, these details are not repeated here.

It will also be understood that, although the terms first, second, etc. are, in some instances, used herein to describe various elements, these elements should not be limited by these terms. These terms are only used to distinguish one element from another. For example, a first electronic device can be termed a second electronic device, and, similarly, a second electronic device can be termed a first electronic device, without departing from the scope of the various described embodiments. The first electronic device and the second electronic device are both electronic device, but they are not the same electronic device.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

The above description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method for controlling duty cycle distortion of clock signals, comprising:
    obtaining an input clock signal having a first frequency;
    obtaining a sampling clock signal having (i) a random noise distribution and (ii) a second frequency that is lower than the first frequency;
    applying the sampling clock signal to sample high voltage duty cycles and low voltage duty cycles of the input clock signal for a duration of time to obtain a sampling result;
    determining a duty cycle distortion level of the input clock signal in the duration of time based on the sampling result; and
    based on the duty cycle distortion level, generating a duty cycle control signal to control the high voltage duty cycles of the input clock signal.

2. The method of claim 1, further comprising:
    generating a first periodic signal that is enabled in each high voltage duty cycle; and
    generating a second periodic signal that is enabled in each low voltage duty cycle of the input clock signal;
    wherein applying the sampling clock signal further includes sampling the first periodic signal and the second periodic signal with the sampling clock signal in the duration of time.

3. The method of claim 2, wherein sampling the first periodic signal and the second periodic signal with the sampling clock signal further comprises:
    combining the first periodic signal and the sampling clock signal by a first XOR logic and a first latch to generate first samples that indicate whether each rising edge of the sampling clock signal is synchronous with the high voltage duty cycles of the input clock signal in the duration of time; and
    accumulating the first samples to determine a first count of rising edges of the sampling clock signal that are synchronous with the high voltage duty cycles of the input clock signal in the duration of time.

4. The method of claim 1, wherein applying the sampling clock signal further comprises:
    determining a first count of rising edges of the sampling clock signal that are synchronous with the high voltage duty cycles of the input clock signal in the duration of time; and
    determining a second count of rising edges of the sampling clock signal that are synchronous with low voltage duty cycles of the input clock signal in the duration of time;
    wherein the duty cycle distortion level of the input clock signal is determined based on the first and second counts.

5. The method of claim 4, wherein the input clock signal corresponds to an inverse clock signal that is substantially complementary to the input clock signal, and the method further comprises:
    in accordance with a determination that the first count is greater than the second count by more than a threshold count, implementing at least one of: (i) reducing the high voltage duty cycles of the input clock signal based on the duty cycle control signal and (ii) increasing high voltage duty cycles of the inverse clock signal based on the duty cycle control signal.

6. The method of claim 1, wherein the input clock signal corresponds to an inverse clock signal that is substantially complementary to the input clock signal, and the method further comprises:
    in accordance with a determination that the first count is less than the second count by more than a threshold count, implementing at least one of: (i) increasing the high voltage duty cycles of the input clock signal based on the duty cycle control signal and (ii) reducing high voltage duty cycles of the inverse clock signal based on the duty cycle control signal.

7. The method of claim 1, wherein the duty cycle control signal includes a multi-bit digital control signal, and the method further comprises:
    controlling the duty cycle of the input clock signal by selecting a first delay time of a first plurality of delay times for the input clock signal by the multi-bit digital control signal.

8. The method of claim 7, wherein the input clock signal corresponds to an inverse clock signal that is substantially complementary to the input clock signal, and the method further comprises:
controlling the duty cycle of the inverse clock signal by selecting a second delay time of a second plurality of delay times for the inverse clock signal by the multi-bit digital control signal.

9. The method of claim 7, wherein the input clock signal is driven by a plurality of parallel buffers, and selecting the first delay time further comprises:
selecting a corresponding subset of the plurality of parallel buffers configured to deliver a respective drive current that enables the first delay time for the input clock signal.

10. The method of claim 7, wherein the input clock signal is coupled to a plurality of parallel load capacitors, and selecting the first delay time further comprises:
selecting and coupling a corresponding subset of the plurality of parallel load capacitors to create a load capacitance that enables the first delay time for the input clock signal.

11. The method of claim 10, wherein:
each load capacitor has a first electrode and a second electrode, and is formed from a transistor device having a source, a drain, a gate, and a body; and
the gate is coupled to the first electrode, and the source, drain, and body of the transistor device are shorted and coupled to the second electrode.

12. The method of claim 7, wherein the input clock signal is coupled to a plurality of successive buffer stages, each buffer stage including a plurality of parallel buffers and a plurality of parallel load capacitors, and selecting the first delay time further comprises, based on the multi-bit digital control signal:
selecting a subset of the plurality of successive buffer stages to be adjusted;
for each selected buffer stage, selecting a respective subset of buffers and a respective subset of load capacitors so that the plurality of successive buffer stages enable the first delay time for the input clock signal.

13. An electronic device, comprising:
sampler circuit, the sampler circuit configured to obtain a sampling clock signal and apply the sampling clock signal to sample high voltage duty cycles and low voltage duty cycles of an input clock signal for a duration of time, wherein the input clock signal has a first frequency, and the sampling clock signal has (i) a random noise distribution and (ii) a second frequency that is lower than the first frequency;
a signal processor coupled to the sampler circuit, the signal processor configured to operate in accordance with sampling of the high voltage duty cycles and the low voltage duty cycles of the input clock signal, thereby determining a duty cycle distortion level of the input clock signal in the duration of time and generating a duty cycle control signal from the duty cycle distortion level; and
a duty cycle modulator coupled to the signal processor, the duty cycle modulator configured to control the high voltage duty cycles of the input clock signal based on the duty cycle control signal.

14. The electronic device of claim 13, wherein the random noise distribution of the sampling clock signal includes a Gaussian distribution centered at the second frequency.

15. The electronic device of claim 13, wherein the second frequency of the sampling clock signal is at least two orders of magnitude greater than the first frequency of the input clock signal.

16. The electronic device of claim 13, wherein the duty cycle control signal is generated to control the duty cycle distortion level of the input clock signal to no greater than 1% of a unit interval of the input clock signal.

17. The electronic device of claim 13, further comprising a circuit configured to:
generate a first periodic signal that is enabled in each high voltage duty cycle; and
generate a second periodic signal that is enabled in each low voltage duty cycle;
wherein applying the sampling clock signal further includes sampling the first periodic signal and the second periodic signal with the sampling clock signal in the duration of time.

18. The electronic device of claim 17, wherein the sampler circuit is further configured to:
combine the first periodic signal and the sampling clock signal by a first XOR logic and a first latch to generate first samples that indicate whether each rising edge of the sampling clock signal is synchronous with the high voltage duty cycles of the input clock signal in the duration of time; and
accumulate the first samples to determine a first count of rising edges of the sampling clock signal that are synchronous with the high voltage duty cycles of the input clock signal in the duration of time.

19. The electronic device of claim 13, further comprising one or more accumulators configured to:
determine a first count of rising edges of the sampling clock signal that are synchronous with the high voltage duty cycles of the input clock signal in the duration of time; and
determine a second count of rising edges of the sampling clock signal that are synchronous with low voltage duty cycles of the input clock signal in the duration of time;
wherein the duty cycle distortion level of the input clock signal is determined based on the first and second counts.

20. A non-transitory computer-readable storage medium, having instructions stored thereon, which when executed by one or more processors cause the processors to implement operations comprising:
obtaining an input clock signal having a first frequency;
obtaining a sampling clock signal having (i) a random noise distribution and (ii) a second frequency that is lower than the first frequency;
applying the sampling clock signal to sample high voltage duty cycles and low voltage duty cycles of the input clock signal in an duration of time to obtain a sampling result;
determining a duty cycle distortion level of the input clock signal in the duration of time based on the sampling result; and
based on the duty cycle distortion level, generating a duty cycle control signal to control a high voltage duty cycles of the input clock signal.

* * * * *